(12) United States Patent
Matsumoto et al.

(10) Patent No.: US 12,543,417 B2
(45) Date of Patent: Feb. 3, 2026

(54) LIGHT EMISSION DEVICE AND LIGHT FIXTURE COMPRISING SAME

(71) Applicant: NICHIA CORPORATION, Anan (JP)

(72) Inventors: Mika Matsumoto, Tokushima (JP); Kazushige Fujio, Tokushima (JP); Atsushi Bando, Anan (JP)

(73) Assignee: NICHIA CORPORATION, Anan (JP)

( * ) Notice: Subject to any disclaimer, the term of this patent is extended or adjusted under 35 U.S.C. 154(b) by 644 days.

(21) Appl. No.: 17/995,109

(22) PCT Filed: Feb. 17, 2021

(86) PCT No.: PCT/JP2021/005868
§ 371 (c)(1),
(2) Date: Sep. 29, 2022

(87) PCT Pub. No.: WO2021/199752
PCT Pub. Date: Oct. 7, 2021

(65) Prior Publication Data
US 2023/0207747 A1     Jun. 29, 2023

(30) Foreign Application Priority Data

Mar. 31, 2020 (JP) ................................. 2020-062103
Jan. 27, 2021 (JP) ................................. 2021-010727

(51) Int. Cl.
*H10H 20/85* (2025.01)
*C09K 11/61* (2006.01)
(Continued)

(52) U.S. Cl.
CPC ....... *H10H 20/8513* (2025.01); *C09K 11/617* (2013.01); *C09K 11/7734* (2013.01);
(Continued)

(58) Field of Classification Search
CPC .................................................. H10H 20/8513
(Continued)

(56) References Cited

U.S. PATENT DOCUMENTS

| 6,504,179 B1 | 1/2003 | Ellens et al. |
| 7,002,291 B2 | 2/2006 | Ellens et al. |

(Continued)

FOREIGN PATENT DOCUMENTS

| CN | 109545941 A | 3/2019 |
| EP | 3249703 A1 | 11/2017 |

(Continued)

*Primary Examiner* — Christopher M Raabe
(74) *Attorney, Agent, or Firm* — Hunton Andrews Kurth LLP

(57) ABSTRACT

A light emission device including a light emitting element having a light emission peak wavelength in a range of 400 nm or more and 490 nm or less, and a fluorescent member including a first fluorescent material having a light emission peak wavelength in a range of 510 nm or more and less than 580 nm, a second fluorescent material having a light emission peak wavelength in a range of 580 nm or more and 680 nm or less and a full width at half maximum of 15 nm or more and 100 nm or less, and a third fluorescent material having a light emission peak wavelength in a range of 600 nm or more and 650 nm or less and a full width at half maximum of 14 nm or less, and having a melanopic ratio (MR) value in a specified range at a certain correlated color temperature.

16 Claims, 28 Drawing Sheets

(51) Int. Cl.
*C09K 11/77* (2006.01)
*H10H 20/851* (2025.01)

(52) U.S. Cl.
CPC .. *C09K 11/77342* (2021.01); *C09K 11/77348* (2021.01); *C09K 11/7774* (2013.01)

(58) Field of Classification Search
USPC ........................................................ 313/501
See application file for complete search history.

(56) References Cited

U.S. PATENT DOCUMENTS

| | | | |
|---|---|---|---|
| 7,183,706 | B2 | 2/2007 | Ellens et al. |
| 8,890,403 | B2 | 11/2014 | Sakuta et al. |
| 9,109,762 | B2 | 8/2015 | Yamakawa et al. |
| 10,008,643 | B2 | 6/2018 | Asai |
| 10,020,427 | B2 | 7/2018 | Hiramatsu et al. |
| 10,084,119 | B2 | 9/2018 | Onuma et al. |
| 10,141,484 | B2 | 11/2018 | Asai |
| 10,434,280 | B2 | 10/2019 | Peeters et al. |
| 10,559,725 | B2 | 2/2020 | Asai |
| 10,818,827 | B2 | 10/2020 | Fujio et al. |
| 10,854,792 | B2 | 12/2020 | Kusano et al. |
| 10,910,526 | B2 | 2/2021 | Amiya et al. |
| 11,011,684 | B2 | 5/2021 | Asai |
| 11,605,761 | B2 | 3/2023 | Fujio et al. |
| 11,990,570 | B2 * | 5/2024 | Kim ................... H10H 20/8513 |
| 2014/0036499 | A1 | 2/2014 | Yamakawa et al. |
| 2016/0149095 | A1 | 5/2016 | Onuma et al. |
| 2016/0372638 | A1 | 12/2016 | Todorov et al. |
| 2017/0179347 | A1 | 6/2017 | Asai |
| 2017/0345976 | A1 | 11/2017 | Asai |
| 2018/0056027 | A1 | 3/2018 | Peeters et al. |
| 2019/0067531 | A1 | 2/2019 | Asai |
| 2019/0097098 | A1 | 3/2019 | Fujio et al. |
| 2020/0135986 | A1 | 4/2020 | Kusano et al. |
| 2020/0135987 | A1 | 4/2020 | Asai |
| 2020/0405997 | A1 * | 12/2020 | Shan ................... H10H 20/8513 |
| 2021/0013383 | A1 | 1/2021 | Fujio et al. |
| 2021/0136891 | A1 * | 5/2021 | Eguchi ................... H05B 45/28 |
| 2021/0308480 | A1 * | 10/2021 | Lorenz ................... A61N 5/0618 |
| 2021/0404632 | A1 * | 12/2021 | Niki ........................... F21V 9/45 |
| 2022/0047890 | A1 * | 2/2022 | Falck ....................... A61M 21/00 |

FOREIGN PATENT DOCUMENTS

| | | |
|---|---|---|
| EP | 3648183 A1 | 5/2020 |
| JP | 2003535477 A | 11/2003 |
| JP | 2003535478 A | 11/2003 |
| JP | 2012104814 A | 5/2012 |
| JP | 2014177511 A | 9/2014 |
| JP | 2014197536 A | 10/2014 |
| JP | 2014202266 A | 10/2014 |
| JP | 2016069576 A | 5/2016 |
| JP | 2016072614 A | 5/2016 |
| JP | 2016154205 A | 8/2016 |
| JP | 2016188263 A | 11/2016 |
| JP | 2016195284 A | 11/2016 |
| JP | 2016207824 A | 12/2016 |
| JP | 2017017317 A | 1/2017 |
| JP | 2017117875 A | 6/2017 |
| JP | 2018511386 A | 4/2018 |
| JP | 2019009126 A | 1/2019 |
| JP | 2019067808 A | 4/2019 |
| JP | 2019117838 A | 7/2019 |
| WO | 2012144087 A1 | 10/2012 |
| WO | 2014203841 A1 | 12/2014 |
| WO | 2019004119 A1 | 1/2019 |

* cited by examiner

LIGHT EMISSION DEVICE AND LIGHT FIXTURE COMPRISING SAME

CROSS-REFERENCE TO RELATED APPLICATIONS

This application is a national stage entry of International Application No. PCT/JP2021/005868, filed on Feb. 17, 2021, which claims priority to Japanese Patent Application No. 2020-062103, filed on Mar. 31, 2020, and Japanese Patent Application No. 2021-010727, filed on Jan. 27, 2021, the disclosures of which are hereby incorporated by reference in their entireties.

TECHNICAL FIELD

The present invention relates to a light emission device and a light fixture provided with the same.

BACKGROUND ART

White light emission devices using a light emitting element of blue light emission and a fluorescent material of yellow light emission are well known as light emission devices using a light emitting element, such as a light emitting diode (hereinafter, referred to as "LED"). Such light emission devices are used in a wide range of fields, such as general lighting, in-vehicle lighting, displays, and backlight for liquid crystal. In recent years, with the spread of LED lighting, there has been growing interest in the influence of LED lighting on a human body. For example, Patent Document 1 describes how LED lighting can affect human circadian rhythms (circadian rhythms; biological rhythms).

The term "circadian" is coined from the Latin words "Circa" for "about" and "Dies" for "day," and means "circadian rhythm". The reason why humans wake up and become sleepy in a daily cycle is that the biological clock inside the body works more than the influence of external environmental factors such as changes in brightness and darkness of the outside world. The human sleep and body temperature rhythm cycle is about 25 hours, which is a little longer than a day, but in normal life, changes in the external environment provide stimuli that correct the phase of the biological clock to synchronize the cycle. Organisms use light as the synchronization factor. The 25-hour cycle of humans is synchronized by moving forward the phase with light exposed in the morning, and the 23-hour cycle of mice is synchronized by moving backward the phase with light exposed before sunset. Accordingly, control of the biological clock triggered by light is very important in forming circadian rhythms.

In 2002, a new photoreceptor, different from rods and cones, was discovered on the retina of mammals, and named intrinsically photosensitive Retinal Ganglion Cell (hereinafter, referred to as "ipRGC"). The ipRGC has a visual substance called melanopsin, which has been shown to be involved in non-visual functions such as light synchronization of circadian rhythms and pupillary reflexes. The ipRGC is a cell that gives optical signals by direct administration to the suprachiasmatic nucleus. The suprachiasmatic nucleus plays the role of a biological clock that controls circadian rhythms in mammals in a very small area in the hypothalamus of the brain, and creates circadian rhythms of various physiological functions such as sleep, arousal, blood pressure, body temperature, and hormone secretion, with approximately 2,000 neurons. Accordingly, control of the intrinsic light response of the ipRGC is very important in forming circadian rhythms.

Melanopsin contained in the ipRGC expresses a photoreceptive protein in approximately 1 to 2% of retinal ganglion cells. Other retinal ganglion cells, which are the majority, are not photosensitive. The photoreceptive substance is known to have different absorption properties depending on the cell, and melanopsin has a peak wavelength in the vicinity of 480 nm to 490 nm. Opsins contained in the cones have a peak wavelength in the vicinity of 440 nm for the S-cone, the vicinity of 535 nm for the M-cone, and the vicinity of 565 nm for the L-cone; and rhodopsin contained in the rods has a peak wavelength in the vicinity of 507 nm.

Melanopsin is also greatly involved in secretion or suppression of melatonin that is a sleep promoting hormone, and it is considered that, for example, the secretion of melatonin is suppressed by increasing the amount of stimulation to the ipRGC. Melatonin shows a peak secretion at night, and when melatonin is secreted, it makes humans sleepy and promotes sleep. Light that suppresses melatonin secretion is considered to be preferable for lighting in places where office work such as computers and meetings are conducted.

In recent years, the concept of Human Centric Lighting (HCL) has begun to spread widely, and in the WELL certification, which is a new building certification focusing on the health of workers, circadian-friendly lighting is listed as an essential item for certification. In the WELL certification, equivalent melanopic lux is used as a quantitative unit of brightness that affects circadian rhythms, and the equivalent melanopic lux in the vertical plane is required to be 250 lux or more after satisfying the conditions of 75% or more of the office space and 4 hours or more per day. To calculate the equivalent melanopic lux, the melanopic ratio (MR) determined from the spectral distribution of the light source is required. The equivalent melanopic lux is calculated by the following formula (1), and the melanopic ratio is calculated by the following formula (2).

$$\text{Equivalent melanopic lux} = \text{Illuminance} \times \text{Melanopic ratio} \quad (1)$$

$$\text{Melanopic ratio} = \frac{\int_{380}^{730} \text{Lamp} \times \text{Circadian}}{\int_{380}^{730} \text{Lamp} \times \text{Visual}} \times 1.218 \quad (2)$$

wherein in the range where the wavelength is 380 nm or more and 730 nm or less, "Lamp×Circadian" refers to a melanopic (circadian response) included in a spectral distribution of a light source, "Lamp×Visual" refers to a visual sensitivity response included in a spectral distribution of a light source, and "1.218" is a constant (lux factor).

To calculate the melanopic ratio, a sensitivity curve of ipRGC (Circadian action curve, absorbance) is used for the action curve of Circadian. A visual sensitivity curve in human photopic vision is used for the action curve of Visual. As a result of using the sensitivity curve of ipRGC and the visual sensitivity curve in human photopic vision, it can be determined that the higher the melanopic ratio is, the more strongly the spectral distribution can stimulate the circadian rhythms.

The melanopic ratio is affected by the components in the vicinity of 480 nm to 490 nm, and it is thus considered that the melanopic ratio tends to increase as the color rendering properties increase, but as a tradeoff for high color rendering properties, a decrease in light emission efficiency becomes a problem. Accordingly, in order to provide lighting in consideration of circadian rhythms, it is required to achieve both controlling the melanopic ratio in response to the circadian and the light emission efficiency.

CITATION LIST

Patent Document

Patent Document 1: International Unexamined Patent Publication No. 2012/144087

SUMMARY OF THE INVENTION

Problem to be Solved by the Invention

Thus, exemplary aspects of the present invention are to provide a light emission device having a spectrum showing a high melanopic ratio, suppressing a decrease in light emission efficiency, and having high color rendering properties suitable for visual work; and a light fixture provided with the same.

Means for Solving Problem

The present invention includes the following aspects.

A first aspect of the present invention relates to a light emission device including a light emitting element that has a light emission peak wavelength in a range of 400 nm or more and 490 nm or less, and a fluorescent member that contains a first fluorescent material having a light emission peak wavelength in a range of 510 nm or more and less than 580 nm, a second fluorescent material having a light emission peak wavelength in a range of 580 nm or more and 680 nm or less and a full width at half maximum of 15 nm or more and 100 nm or less in a light emission spectrum, and a third fluorescent material having a light emission peak wavelength in a range of 600 nm or more and 650 nm or less and a full width at half maximum of 14 nm or less in a light emission spectrum, wherein the light emission device has a melanopic ratio (MR) value that satisfies the following ranges, respectively, at the following correlated color temperature ranges (1) to (5).
  (1) When the correlated color temperature is in a range of 2,000 K or more and less than 2,800 K, the MR value is in a range of 0.47 or more and 0.73 or less; (2) when the correlated color temperature is in a range of 2,800 K or more and less than 3,500 K, the MR value is in a range of 0.53 or more and 0.81 or less; (3) when the correlated color temperature is in a range of 3,500 K or more and less than 4,500 K, the MR value is in a range of 0.68 or more and 1.00 or less; (4) when the correlated color temperature is in a range of 4,500 K or more and less than 5,700 K, the MR value is in a range of 0.84 or more and 1.18 or less; and (5) when the correlated color temperature is in a range of 5,700 K or more and less than 7,200 K, the MR value is in a range of 1.00 or more and 1.40 or less.

A second aspect of the present invention relates to a light fixture provided with the light emission device.

Effect of the Invention

In accordance with certain exemplary aspects of the present invention, a light emission device having a spectrum showing a high melanopic ratio, suppressing a decrease in light emission efficiency, and having high color rendering properties suitable for visual work, and a light fixture provided with the same, can be provided.

MODE(S) FOR CARRYING OUT THE INVENTION

Figure 1:
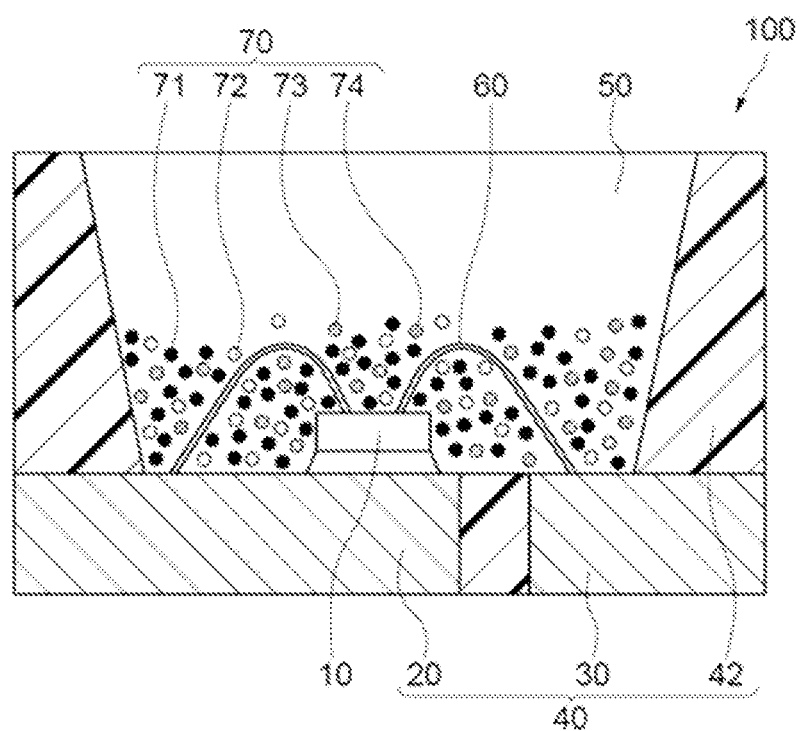
FIG. 1 is a schematic cross-sectional view showing an exemplary light emission device of the present invention.

The light emission device and the light fixture provided with the same according to the present invention will be hereunder described on the basis of embodiments. The embodiments described below are those exemplifying a light emission device and a light fixture provided with the same for the purpose of embodying the technical idea of the present invention, and the present invention is not limited to the following light emission devices and light fixtures provided with the same.

The relationships between color names and chromaticity coordinates, and the relationships between wavelength ranges of light and color names of monochromic light are in accordance with Japanese Industrial Standard (JIS) Z8110. The content of each component in a composition means, in the case where plural substances corresponding to each component are present in the composition, a total amount of the plural substances present in the composition, unless otherwise specified.

[Light Emission Device]

The light emission device includes a light emitting element that has a light emission peak wavelength in a range of 400 nm or more and 490 nm or less, and a fluorescent member that contains a first fluorescent material having a light emission peak wavelength in a range of 510 nm or more and less than 580 nm, a second fluorescent material having a light emission peak wavelength in a range of 580 nm or more and 680 nm or less and a full width at half maximum of 15 nm or more and 100 nm or less in a light emission spectrum, and a third fluorescent material having a light emission peak wavelength in a range of 600 nm or more and 650 nm or less and a full width at half maximum of 14 nm or less in a light emission spectrum, wherein the light emission device has a melanopic ratio (MR) value that satisfies the following ranges, respectively, at a correlated color temperature in a range shown in any of the following (1) to (5). The melanopic ratio in the present specification is calculated using an action curve normalized by setting the sensitivity at each peak wavelength of the sensitivity curve of ipRGC and the visual sensitivity curve in human photopic vision to 1.

(1) When the correlated color temperature is in a range of 2,000 K or more and less than 2,800 K, the MR value is, for example, 0.47 or more, preferably 0.48 or more, more preferably 0.50 or more, and even more preferably 0.51 or more; and is 0.73 or less, preferably 0.68 or less, and more preferably 0.63 or less.

(2) When the correlated color temperature is in a range of 2,800 K or more and less than 3,500 K, the MR value is, for example, 0.53 or more, preferably 0.54 or more, and more preferably 0.56 or more; and is 0.81 or less, preferably 0.76 or less, and more preferably 0.71 or less.

(3) When the correlated color temperature is in a range of 3,500 K or more and less than 4,500 K, the MR value is, for example, 0.68 or more, preferably 0.69 or more, and more preferably 0.70 or more; and is 1.00 or less, preferably 0.95 or less, and more preferably 0.90 or less.

(4) When the correlated color temperature is in a range of 4,500 K or more and less than 5,700 K, the MR value is, for example, 0.84 or more, preferably 0.85 or more, more preferably 0.89 or more, and even more preferably 0.93 or more; and is 1.18 or less, preferably 1.13 or less, and more preferably 1.08 or less.

(5) When the correlated color temperature is in a range of 5,700 K or more and less than 7,200 K, the MR value is, for example, 1.00 or more, preferably 1.01 or more, and more preferably 1.04 or more; and is 1.40 or less, preferably 1.35 or less, and more preferably 1.30 or less.

An example of the light emission device will be hereunder described with reference to the drawing. FIG. 1 is a schematic cross-sectional view showing a light emission device 100.

As shown in FIG. 1, the light emission device 100 includes a light emitting element 10 having a light emission peak wavelength in a range of 400 nm or more and 490 nm or less, and a fluorescent member 50 containing a fluorescent material 70 that is excited by light emitted from the light emitting element and emits light.

The light emission device 100 includes, for example, a molded body 40, a light emitting element 10, and a fluorescent member 50. The molded body 40 is formed by integrally molding a first lead 20, a second lead 30, and a resin portion 42 containing a thermoplastic resin or a thermosetting resin. The molded body 40 forms a recessed portion having a bottom surface and side surfaces therein, in which the light emitting element 10 is mounted on the bottom surface of the recessed portion. The light emitting element 10 has a pair of positive and negative electrodes, and the pair of positive and negative electrodes each are electrically connected to the first lead 20 and the second lead 30 via a wire 60. The light emitting element 10 is covered with the fluorescent member 50. The fluorescent member 50 includes, for example, a fluorescent material 70 that converts the wavelength of light emitted from the light emitting element 10, and a sealing material. The fluorescent material 70 has at least one light emission peak wavelength in a specific wavelength range by being excited by the light emitted from the light emitting element, and may include two or more types of fluorescent materials differing in the wavelength range of the light emission peak wavelength. The first lead 20 and the second lead 30 connected to the pair of positive and negative electrodes of the light emitting element 10 are partly exposed to the outside of the package constituting the light emission device 100. The light emission device 100 is able to emit light upon receiving external power supply via the first lead 20 and second lead 30.

The light emission peak wavelength of the light emitting element 10 is, for example, 400 nm or more, preferably 410 nm or more, more preferably 430 nm or more, and even more preferably 440 nm or more; and is, for example, 490 nm or less, preferably 480 nm or less, more preferably 470 nm or less, and even more preferably 460 nm or less.

The full width at half maximum in the light emission spectrum of the light emitting element 10 may be, for example, 30 nm or less, may be 25 nm or less, and may be 20 nm or less. The full width at half maximum means a full width at half maximum (FWHM) of the maximum light emission peak in the light emission spectrum, which is a wavelength width of the light emission peak that indicates 50% of the maximum value of the light emission peak in each light emission spectrum. The light emitting element 10 is, for example, preferably a semiconductor light emitting element using a nitride-based semiconductor ($In_XAl_YGa_{1-X-Y}N$, $0 \leq X$, $0 \leq Y$, $X+Y \leq 1$). Using a semiconductor light emitting element as the light emitting element, a stable light emission device having high efficiency and high linearity relative to input, and resistant to high mechanical impact can be obtained.

Fluorescent Member 50

The fluorescent member 50 contains a fluorescent material 70 and at least a resin. The fluorescent member 50 contains, due to the light emitted from the light emitting element 10, at least one type of first fluorescent material 71 having a light emission peak wavelength in a range of 510 nm or more and less than 580 nm, at least one type of second fluorescent material 72 having a light emission peak wavelength in a range of 580 nm or more and 680 nm or less and a full width at half maximum of 15 nm or more and 100 nm or less in the light emission spectrum, and at least one type of third fluorescent material 73 having a light emission peak wavelength in a range of 600 nm or more and 650 nm or less and a full width at half maximum of 14 nm or less in the light emission spectrum. The fluorescent member 50 may contain a first fluorescent material 71, a second fluorescent material 72, a third fluorescent material 73, optionally a fourth fluorescent material 74, and other fluorescent materials.

First Fluorescent Material 71

The light emission peak wavelength of the first fluorescent material 71 is in a range of 510 nm or more and less than 580 nm, preferably in a range of 510 nm or more and 560 nm or less, more preferably in a range of 510 nm or more and 540 nm or less, and even more preferably in a range of 515 nm or more and 526 nm or less. The full width at half maximum in the light emission spectrum of the first fluorescent material 71 is, for example, 90 nm or more, preferably 92 nm or more, and more preferably 95 nm or more; and is, for example, 125 nm or less, preferably 120 nm or less, and more preferably 115 nm or less.

From the viewpoint of obtaining a desired light emission intensity in the light emission spectrum of the light emission device and obtaining a light emission spectrum that suppresses melatonin secretion, the first fluorescent material 71 is preferably at least one selected from the group consisting of, for example, a rare earth aluminate fluorescent material, a scandium-based fluorescent material, an alkaline earth metal silicate fluorescent material, and a lanthanoid silicon nitride fluorescent material. The first fluorescent material 71 may be used alone, or may be used in combination of two or more thereof.

The first fluorescent material 71 is preferably a rare earth aluminate fluorescent material having a composition represented by the following formula (1A).

$$(Ln_{1-a}Ce_a)_3(Al_{1-b}Ga_b)_5O_{12} \tag{1A}$$

In the formula (1A), Ln includes at least one rare earth element selected from the group consisting of Y, Gd, Lu, and Tb; and a and b each satisfy $0.001 \leq a \leq 0.2$ and $0 \leq b \leq 1.0$.

The first fluorescent material 71 may contain at least one selected from the group consisting of a scandium-based fluorescent material having a composition represented by the following formula (1B), an alkaline earth metal silicate fluorescent material having a composition represented by the following formula (1C), and a lanthanoid silicon nitride fluorescent material having a composition represented by the following formula (1D).

$$(Ca,Sr)Sc_2O_4{:}Ce \tag{1B}$$

$$(Ca,Sr)_3(Sc,Mg)_2Si_3O_{12}{:}Ce \tag{1C}$$

$$(La,Y,Gd)_3Si_6N_{11}{:}Ce \tag{1D}$$

In the present specification, plural elements sectioned by the comma (,) in the compositional formula mean that at least one of these plural elements is contained in the composition. The plural elements sectioned by the comma (,) in the compositional formula mean that at least one element selected from the plural elements thus sectioned by the comma is contained in the composition, and two or more elements selected from the plural elements may be contained therein in combination. In the present specification, in the formula representing the composition of a fluorescent material, the part before the colon (:) represents a host crystal, and the part after the colon (:) represents an activating element.

The first fluorescent material has a content ratio preferably in a range of 20% by mass or more and 90% by mass or less relative to the total amount of the fluorescent materials contained in the fluorescent member.

When the correlated color temperature is in a range of 2,000 K or more and less than 2,800 K, the content ratio of the first fluorescent material to the total amount of the fluorescent materials contained in the fluorescent member is more preferably 30% by mass or more, and even more preferably 35% by mass or more; and is more preferably 80% by mass or less, and even more preferably 70% by mass or less.

When the correlated color temperature is in a range of 2,800 K or more and less than 3,500 K, the content ratio of the first fluorescent material to the total amount of the fluorescent materials contained in the fluorescent member is more preferably 25% by mass or more, and even more preferably 30% by mass or more; and is more preferably 80% by mass or less, and even more preferably 70% by mass or less.

When the correlated color temperature is in a range of 3,500 K or more and less than 4,500 K, the content ratio of the first fluorescent material to the total amount of the fluorescent materials contained in the fluorescent member is more preferably 25% by mass or more, and even more preferably 30% by mass or more; and is more preferably 80% by mass or less, and even more preferably 70% by mass or less.

When the correlated color temperature is in a range of 4,500 K or more and less than 5,700 K, the content ratio of the first fluorescent material to the total amount of the fluorescent materials contained in the fluorescent member is more preferably 25% by mass or more, and even more preferably 30% by mass or more; and is more preferably 85% by mass or less, and even more preferably 80% by mass or less.

When the correlated color temperature is in a range of 5,700 K or more and less than 7,200 K, the content ratio of the first fluorescent material to the total amount of the fluorescent materials contained in the fluorescent member is more preferably 20% by mass or more, and even more preferably 25% by mass or more; and is more preferably 85% by mass or less, and even more preferably 80% by mass or less.

The first fluorescent material 71 has an average particle diameter, for example, in a range of 3 μm or more and 40 μm or less, and preferably in a range of 5 μm or more and 35 μm or less. By increasing the average particle diameter, the light emission intensity of the first fluorescent material that is excited by the light emitted from the light emitting element 10 can be enhanced. By decreasing the average particle diameter, workability in the production process of the light emission device can be improved.

Second Fluorescent Material 72

The second fluorescent material 72 is excited by the light emitted from the above-mentioned light emitting element 10 and has a light emission peak wavelength in a range of 580 nm or more and 680 nm or less. The light emission peak wavelength of the second fluorescent material 72 is preferably in a range of 600 nm or more and 640 nm or less. The full width at half maximum in the light emission spectrum of the second fluorescent material 72 is 15 nm or more, preferably 18 nm or more, and more preferably 20 nm or more; and is 100 nm or less, preferably 95 nm or less, and more preferably 90 nm or less.

From the viewpoint of obtaining a desired light emission intensity in the light emission spectrum of the light emission device and obtaining a light emission spectrum that suppresses melatonin secretion, the second fluorescent material 72 is preferably at least one selected from the group consisting of, for example, a silicon nitride-based fluorescent material, an alkaline earth metal silicon nitride-based fluorescent material, an α-SiAlON fluorescent material, a fluorogermanate fluorescent material, and a sulfide fluorescent material. The second fluorescent material 72 may be used alone, or may be used in combination of two or more thereof.

The second fluorescent material 72 preferably contains at least one fluorescent material selected from an alkaline earth metal silicon nitride fluorescent material having a composition represented by the following formula (2A) or (2B) and an α-SiAlON fluorescent material having a composition represented by the following formula (2C).

$$Sr_sCa_tAl_uSi_vN_w:Eu \quad (2A)$$

In the formula (2A), s, t, u, v, and w each satisfy $0 \leq s < 1$, $0 < t \leq 1$, $s+t \leq 1$, $0.9 \leq u \leq 1.1$, $0.9 \leq v \leq 1.1$, and $2.5 \leq w \leq 3.5$.

$$(Ca_{1-q-r}Sr_qBa_r)_2Si_5N_8:Eu \quad (2B)$$

In the formula (2B), q and r each satisfy $0 \leq q \leq 1.0$, $0 \leq r \leq 1.0$, and $q+r \leq 1.0$.

$$M^4{}_kSi_{12-(m+n)}Al_{m+n}O_nN_{16-n}:Eu \quad (2C)$$

In the formula (2C), $M^4$ includes at least one element selected from the group consisting of Li, Mg, Ca, Sr, Y, and lanthanoid elements (excluding La and Ce); and k, m, and n each satisfy $0 < k \leq 2.0$, $2.0 \leq m \leq 6.0$, and $0 \leq n \leq 1.0$.

The second fluorescent material 72 may contain at least one selected from the group consisting of a fluorogermanate fluorescent material having a composition represented by the following formula (2E), a silicon nitride-based fluorescent material having a composition represented by the following formula (2F), and a sulfide fluorescent material having a composition represented by the following formula (2G).

$$(i-j)MgO \cdot (j/2)Sc_2O_3 \cdot hMgF_2 \cdot pCaF_2 \cdot (1-z)GeO_2 \cdot (z/2)M^6{}_2O_3:Mn \quad (2E)$$

In the formula (2E), $M^6$ includes at least one element selected from the group consisting of Al, Ga, and In; and i, j, h, p, and z each satisfy $2 \leq i \leq 4$, $0 \leq j < 0.5$, $0 < h < 1.5$, $0 \leq p < 1.5$, and $0 < z < 0.5$.

$$M^7{}_{b1}M^8{}_{c1}Al_{3-e1}Si_{e1}N_{f1}:M^9 \quad (2F)$$

In the formula (2F), $M^7$ includes at least one element selected from the group consisting of Ca, Sr, Ba, and Mg; $M^8$ includes at least one element selected from the group consisting of Li, Na, and K; $M^9$ includes at least one element selected from the group consisting of Eu, Ce, Tb, and Mn; and b1, c1, e1, and f1 each satisfy $0.80 \leq b1 \leq 1.05$, $0.80 \leq c1 \leq 1.05$, $0 \leq e1 \leq 0.5$, and $3.0 \leq f1 \leq 5.0$.

$$(Ca,Sr)S:Eu \quad (2G)$$

The second fluorescent material has a content ratio preferably in a range of 0.5% by mass or more and 15% by mass or less, and more preferably in a range of 1% by mass or more and 10% by mass or less, relative to the total amount of the fluorescent materials contained in the fluorescent member.

The second fluorescent material 72 has an average particle diameter, for example, in a range of 1 μm or more and 40 μm or less, and preferably in a range of 5 μm or more and 30 μm or less. By increasing the average particle diameter, the light emission intensity of the second fluorescent material that is excited by the light emitted from the light emitting element 10 can be enhanced. By decreasing the average particle diameter, workability in the production process of the light emission device can be improved.

Third Fluorescent Material 73

The third fluorescent material 73 is excited by the light emitted from the light emitting element 10 and has a light emission peak wavelength in a range of 600 nm or more and 650 nm or less. The third fluorescent material 73 preferably has a light emission peak wavelength in a range of 620 nm or more and 640 nm or less due to the light emitted from the light emitting element. The full width at half maximum in the light emission spectrum of the third fluorescent material 73 is 14 nm or less, preferably 12 nm or less, and more preferably 10 nm or less.

The third fluorescent material 73 is preferably a fluoride fluorescent material having a composition represented by the following formula (3D).

$$A_2[M^5{}_{1-a1}Mn^{4+}{}_{a1}F_6] \tag{3D}$$

In the formula (3D), A includes at least one selected from the group consisting of alkali metals and ammonium ions, and preferably includes at least potassium; $M^5$ includes at least one element selected from the group consisting of Group 4 elements, Group 13 elements, and Group 14 elements, preferably includes at least one element selected from the group consisting of silicon, aluminum, germanium, and titanium, and more preferably includes at least one element selected from the group consisting of silicon and aluminum; and a1 satisfies $0.01<a1<0.2$.

The third fluorescent material has a content ratio preferably in a range of 5% by mass or more and 70% by mass or less relative to the total amount of the fluorescent materials contained in the fluorescent member.

When the correlated color temperature is in a range of 2,000 K or more and less than 2,800 K, the content ratio of the third fluorescent material to the total amount of the fluorescent materials contained in the fluorescent member is more preferably 10% by mass or more, and even more preferably 20% by mass or more; and is more preferably 60% by mass or less, even more preferably 50% by mass or less, and still more preferably 40% by mass or less.

When the correlated color temperature is in a range of 2,800 K or more and less than 3,500 K, the content ratio of the third fluorescent material to the total amount of the fluorescent materials contained in the fluorescent member is more preferably 7% by mass or more, and even more preferably 10% by mass or more; and is more preferably 65% by mass or less, even more preferably 55% by mass or less, and still more preferably 45% by mass or less.

When the correlated color temperature is in a range of 3,500 K or more and less than 4,500 K, the content ratio of the third fluorescent material to the total amount of the fluorescent materials contained in the fluorescent member is more preferably 7% by mass or more, and even more preferably 10% by mass or more; and is more preferably 65% by mass or less, even more preferably 60% by mass or less, and still more preferably 45% by mass or less.

When the correlated color temperature is in a range of 4,500 K or more and less than 5,700 K, the content ratio of the third fluorescent material to the total amount of the fluorescent materials contained in the fluorescent member is more preferably 7% by mass or more, and even more preferably 10% by mass or more; and is more preferably 55% by mass or less, even more preferably 45% by mass or less, and still more preferably 30% by mass or less.

When the correlated color temperature is in a range of 5,700 K or more and less than 7,200 K, the content ratio of the third fluorescent material to the total amount of the fluorescent materials contained in the fluorescent member is more preferably 5% by mass or more, and even more preferably 6% by mass or more; and is more preferably 55% by mass or less, even more preferably 40% by mass or less, and still more preferably 25% by mass or less.

The content ratio of the third fluorescent material to the total amount of the second fluorescent material and the third fluorescent material is, for example, in a range of 60% by mass or more and 99% by mass or less, preferably in a range of 65% by mass or more and 98% by mass or less, and more preferably in a range of 70% by mass or more and 98% by mass or less.

The third fluorescent material 73 has an average particle diameter, for example, in a range of 1 μm or more and 40 μm or less, and preferably in a range of 5 μm or more and 30 μm or less. By increasing the average particle diameter, the light emission intensity of the third fluorescent material that is excited by the light emitted from the light emitting element 10 can be enhanced. By decreasing the average particle diameter, workability in the production process of the light emission device can be improved.

Fourth Fluorescent Material 74

It is preferable that the fluorescent member further contains a fourth fluorescent material having a light emission peak that is different from that of the first fluorescent material and is in a range of 470 nm or more and 550 nm or less. The fourth fluorescent material 74 has a light emission peak wavelength of, for example, 470 nm or more, preferably 475 nm or more, and more preferably 480 nm or more; and, for example, 550 nm or less, preferably 540 nm or less, more preferably 530 nm or less, and even more preferably 520 nm or less, due the light emitted from the light emitting element. The fourth fluorescent material preferably contains an alkaline earth metal aluminate fluorescent material having a composition represented by the following formula (4a) (hereinafter, may be referred to as "SAE"), and an alkaline earth metal chlorosilicate fluorescent material having a composition represented by the following formula (4b) (hereinafter, may be referred to as "CMSC").

$$(Sr_{1-v1}M^1{}_{v1})_4Al_4O_{25}{:}Eu \tag{4a}$$

In the formula (4a), $M^1$ includes at least one element selected from the group consisting of Mg, Ca, Ba, and Zn; and v1 satisfies $0 \leq v1 \leq 0.5$.

$$M^2{}_8MgSi_4O_{16}X_2{:}Eu \tag{4b}$$

In the formula (4b), $M^2$ includes at least one element selected from the group consisting of Ca, Sr, Ba, and Zn; and X includes at least one element selected from the group consisting of F, Cl, Br, and I.

The fourth fluorescent material may also contain a β-SiAlON fluorescent material having a composition represented by the following formula (4c), a sulfide fluorescent material having a composition represented by the following formula (4d) or (4e), and an alkaline earth metal silicate fluorescent material having a composition represented by the following formula (4f).

$$Si_{6-e}Al_eO_eN_{8-e}{:}Eu \text{ (wherein } 0<e\leq4.2) \tag{4c}$$

$$(Sr,M^3)Ga_2S_4{:}Eu \tag{4d}$$

$$(Sr_{1-f-g}M^3{}_f Eu_g)Ga_2S_4 \tag{4e}$$

In the formula (4d) or (4e), $M^3$ includes at least one element selected from the group consisting of Be, Mg, Ca, Ba, and Zn; and wherein in the formula (4e), f and g each satisfy $0.03 \leq f \leq 0.25$, $0 \leq g < 0.97$, and $f+g<1$.

$$(Ca,Sr,Ba)_2SiO_4{:}Eu \tag{4f}$$

The full width at half maximum in the light emission spectrum of the fourth fluorescent material 74 is 20 nm or more, preferably 30 nm or more, and more preferably 40 nm or more; and is 85 nm or less, preferably 80 nm or less, and more preferably 70 nm or less.

The fourth fluorescent material has a content ratio preferably in a range of 1% by mass or more and 70% by mass or less relative to the total amount of the fluorescent materials contained in the fluorescent member.

When the correlated color temperature is in a range of 2,000 K or more and less than 2,800 K, the content ratio of the fourth fluorescent material to the total amount of the fluorescent materials contained in the fluorescent member is more preferably 2% by mass or more; and is more preferably 50% by mass or less, and even more preferably 40% by mass or less.

When the correlated color temperature is in a range of 2,800 K or more and less than 3,500 K, the content ratio of the fourth fluorescent material to the total amount of the fluorescent materials contained in the fluorescent member is more preferably 2% by mass or more; and is more preferably 50% by mass or less, and even more preferably 35% by mass or less.

When the correlated color temperature is in a range of 3,500 K or more and less than 4,500 K, the content ratio of the fourth fluorescent material to the total amount of the fluorescent materials contained in the fluorescent member is more preferably 2% by mass or more; and is more preferably 65% by mass or less, and even more preferably 45% by mass or less.

When the correlated color temperature is in a range of 4,500 K or more and less than 5,700 K, the content ratio of the fourth fluorescent material to the total amount of the fluorescent materials contained in the fluorescent member is more preferably 2% by mass or more; and is more preferably 65% by mass or less, and even more preferably 55% by mass or less.

When the correlated color temperature is in a range of 5,700 K or more and less than 7,200 K, the content ratio of the fourth fluorescent material to the total amount of the fluorescent materials contained in the fluorescent member is more preferably 2% by mass or more; and is more preferably 65% by mass or less, and even more preferably 60% by mass or less.

The fourth fluorescent material 74 has an average particle diameter, for example, in a range of 3 μm or more and 40 μm or less, and preferably in a range of 5 μm or more and 30 μm or less. By increasing the average particle diameter, the light emission intensity of the fourth fluorescent material that is excited by the light emitted from the light emitting element 10 can be enhanced. By decreasing the average particle diameter, workability in the production process of the light emission device can be improved.

The fluorescent materials used may be commercially available fluorescent materials, and for example, the third fluorescent material may be produced with reference to the production methods described in Japanese Patent Application Nos. 2014-202266 and 2020-212532, which are previously filed by the present applicant. The other fluorescent materials may be produced, for example, in the following manner. A single unit of element, an oxide, a carbonate, a nitride, a chloride, a fluoride, a sulfide, and the like are used as raw materials to be contained in the compositions of the fluorescent materials, and the raw materials each are weighed to have a predetermined composition ratio. Additive materials such as flux are also appropriately added to the raw materials and mixed by a wet method or a dry method using a mixer. This allows the solid phase reaction to be accelerated to form particles having a uniform size. The mixer used may be a ball mill that is generally industrially used, as well as a pulverizer such as a vibration mill, a roll mill, or a jet mill. The raw materials can be pulverized using a pulverizer to increase the specific surface area. To regulate the specific surface area of the raw material powders to a certain range, the powders can be classified using: a wet separator such as a sedimentation tank, a hydrocyclone, or a centrifugal separator; or a dry classifier such as a cyclone or an air separator, which are generally industrially used. The raw materials thus mixed are charged in a crucible made of SiC, quartz, alumina, BN, or the like, and calcined in an inert atmosphere such as argon or nitrogen, or in a reducing atmosphere containing hydrogen. The calcining is performed at a predetermined temperature and time. The calcined product is subjected to pulverization, dispersion, filtration, and the like, to obtain a desired fluorescent material powder. Solid-liquid separation can be performed by an industrially generally used method such as filtration, suction filtration, pressure filtration, centrifugal separation, or decantation. Drying can be performed using an industrially generally used apparatus such as a vacuum dryer, a hot air dryer, a conical dryer, or a rotary evaporator.

The fluorescent member used in the light emission device preferably includes a fluorescent material 70 and a sealing material. Examples of the sealing material include a silicone resin and an epoxy resin. The fluorescent member may contain other components such as a filler, a light stabilizer, and a colorant, in addition to the red fluorescent material and the sealing material. Examples of the filler include silica, barium titanate, titanium oxide, and aluminum oxide. The content of the other component than the fluorescent material and the sealing material in the fluorescent member varies depending on the size of the targeted light emission device, the correlated color temperature of the targeted mixed light, and the color tone of the mixed light; and can be set in an appropriate range based on the targeted correlated color temperature and the color tone. For example, the content of the other component than the fluorescent material and the sealing material in the fluorescent member can be 0.01 part by mass or more and 20 parts by mass or less relative to 100 parts by mass of the sealing material.

[Light Emission Characteristics]

The method for evaluating color rendering properties of a light source is specified by JIS Z8726. Specifically, it is specified that, for 15 types of test colors (numbers 1 to 15) each having predetermined reflectance characteristics, the color rendering index is determined by numerically calculating the color difference ΔEi (i is an integer from 1 to 15) obtained by measuring the colors of a test light source and a reference light source, respectively. Each value of the special color rendering indices Ri (i is an integer from 1 to 15) thus calculated has an upper limit of 100; and the smaller the color difference between the test light source and the reference light source having a color temperature corresponding to the test light source, the higher the each value of the special color rendering indices Ri, which approaches 100. Among the special color rendering indices Ri, for R1 to R8, these values are averaged and evaluated as an average color rendering index (hereinafter, simply referred to as "Ra"), and for R9 to R15, these values are individually evaluated as special color rendering indices. In the special color rendering indices R9 to R15, it is designated that R9 is for red, R10 is for yellow, R11 is for green, R12 is for blue, R13 is for a color of Westerner skin, R14 is for a color of tree leaves, and R15 is for a color of Japanese skin.

JIS has published a classification (JIS Z9112) that corresponds to light sources of fluorescent lamps and LEDs and color rendering properties, which defines a preferred average color rendering index and special color rendering indices depending on the place of use.

The light emission device is capable of achieving Class 1 or Class 2 of the high color rendering type of JIS Z9112. The Ra of the light emission device is, for example, 80 or more, preferably 85 or more, more preferably 90 or more, and even more preferably 95 or more. The special color rendering index R9 of the light emission device is, for example, 50 or more, preferably 55 or more, more preferably 70 or more, and even more preferably 80 or more. The special color rendering index R15 is, for example, 70 or more, preferably 85 or more, and more preferably 90 or more.

The light emitted from the light emission device may be, for example, light having chromaticity coordinates, as specified in CIE 1931, in a range of x=0.28 to 0.55 and y=0.29 to 0.44, and may also be light having chromaticity coordinates in a range of x=0.31 to 0.45 and y=0.32 to 0.43.

The correlated color temperature of the light emitted from the light emission device may be, for example, 2,000 K or more, and may be 2,700 K or more. The correlated color temperature may be 7,000 K or less, and may be 6,500 K or less.

[Light Fixture]

The light fixture may include at least one of the above-mentioned light emission devices. The light fixture may further include at least one of the above-mentioned light emission devices, and a known light emission device that emits white mixed light in combination. The light fixture may further include members such as a reflecting member, a protective member, and an auxiliary device for supplying electric power to the light emission devices, in addition to the above-mentioned light emission devices. The light fixture may include a plurality of the above-mentioned light emission devices. In the case where the light fixture is provided with plural light emission devices, it may be provided with plural light emission devices that are the same as each other, and it may be provided with, for example, plural light emission devices that are different in correlated color temperature from each other. It may also be provided with a driving device capable of individually driving plural light emission devices to adjust the brightness and the correlated color temperature depending on the preference. A form of use of the light fixture may be any of a direct attaching-type, an embedding-type, and a pendant-type.

EXAMPLES

The present invention will be hereunder specifically described by reference to the following Examples. The present invention is not limited to these Examples.

First Fluorescent Material 71

As the first fluorescent material, a rare earth aluminate fluorescent material having a composition represented by the following formula (1a) (hereinafter, also referred to as "G-LAG" or "LAG") and a rare earth aluminate fluorescent material having a composition represented by the following formula (1b) (hereinafter, also referred to as "G-YAG" or "YAG") were prepared. Here, the rare earth aluminate fluorescent materials containing Ga in the compositions are described as "G-LAG" and "G-YAG", respectively.

$$Lu_3(Al,Ga)_5O_{12}:Ce \qquad (1a)$$

$$Y_3(Al,Ga)_5O_{12}:Ce \qquad (1b)$$

As to the first fluorescent materials, G-LAG, LAG, G-YAG1, G-YAG2, and YAG, which are obtained by adjusting the molar ratio of the element contained in the above-mentioned compositions (for example, Ce as an activator), the light emission peak wavelength and the full width at half maximum of each fluorescent material are shown in Table 1 below.

TABLE 1

| First fluorescent material | Light emission peak wavelength (nm) | Full width at half maximum (nm) |
|---|---|---|
| G-LAG | 523 | 100 |
| LAG | 528 | 100 |
| G-YAG1 | 535 | 106 |
| G-YAG2 | 540 | 107 |
| YAG | 549 | 109 |

Second Fluorescent Material 72

As the second fluorescent material, a silicon nitride-based fluorescent material having a composition represented by the following formula (2a) was prepared.

$$(Sr,Ca)AlSiN_3:Eu \qquad (2a)$$

As to the second fluorescent materials, SCASN1, SCASN2, SCASN3, and SCASN4, which are obtained by adjusting the molar ratio of the element contained in the above-mentioned composition (for example, Eu as an activator), the light emission peak wavelength and the full width at half maximum of each fluorescent material are shown in Table 2 below.

TABLE 2

| Second fluorescent material | Light emission peak wavelength (nm) | Full width at half maximum (nm) |
|---|---|---|
| SCASN1 | 610 | 72 |
| SCASN2 | 620 | 74 |
| SCASN3 | 625 | 73 |
| SCASN4 | 630 | 76 |

Third Fluorescent Material 73

As the third fluorescent material, a fluoride fluorescent material having a composition represented by $K_2SiF_6:Mn$ (hereinafter, also referred to as "KSF") was prepared. The third fluorescent material had a light emission peak wavelength of 630 nm and a full width at half maximum of 7 nm.

Fourth Fluorescent Material 74

As the fourth fluorescent material, an alkaline earth metal aluminate fluorescent material having a composition represented by $Sr_4Al_{14}O_{25}:Eu$ (hereinafter, also referred to as "SAE") was prepared.

Further, as the fourth fluorescent material, an alkaline earth metal chlorosilicate fluorescent material having a composition represented by $Ca_8MgSi_4O_{16}Cl_2:Eu$ (hereinafter, also referred to as "CMSC") was prepared.

As to the fourth fluorescent materials, SAE, CMSC1, and CMSC2, which are obtained by adjusting the molar ratio of the element contained in the above-mentioned compositions (for example, Eu as an activator), the light emission peak wavelength and the full width at half maximum of each fluorescent material are shown in Table 3 below.

TABLE 3

| Fourth fluorescent material | Light emission peak wavelength (nm) | Full width at half maximum (nm) |
|---|---|---|
| SAE | 495 | 60 |
| CMSC1 | 511 | 55 |
| CMSC2 | 515 | 58 |

Example 1

In the light emission device 100, a nitride semiconductor having a light emission peak wavelength at 450 nm was used as the light emitting element 10. A silicone resin was used as the sealing material constituting the fluorescent member 50. The fluorescent material 70 in which the first fluorescent material 71, the second fluorescent material 72, and the third fluorescent material 73 were blended such that the chromaticity coordinates in CIE 1931 were located in the vicinity of x=0.458 and y=0.410, and the silicone resin were mixed and dispersed, and then defoamed to obtain a fluorescent member-forming resin composition. The fluorescent member-forming composition was injected onto the light emitting element 10 on the recessed portion of the molded body 40 to be filled in the recessed portion, and then heated at 150° C. for 3 hours to cure the fluorescent member-forming composition and to form the fluorescent member 50, thereby producing the light emission device 100 as shown in FIG. 1.

The light emission device obtained in Example 1 as well as the light emission devices in Examples and Comparative Examples described later were each measured for the chromaticity coordinates, the correlated color temperature (Tcp; K), the average color rendering index (Ra (R1 to R8)), and the special color rendering indices (R9 to R15) of the light emitting color. Specifically, the light emission devices used in Examples and Comparative Examples were each measured for the chromaticity coordinates (x, y) in the chromaticity coordinate system of the CIE 1931 chromaticity diagram, the luminous flux, and the radiant flux (spectral total radiant flux) using an optical measurement system combining a spectrophotometer (PMA-12, manufactured by Hamamatsu Photonics K.K.) and an integral sphere. The results of the chromaticity coordinates and the correlated color temperature (Tcp; K) of the light emitting color are shown in Tables 4 to 7. The results of the color rendering indices are shown in Table 4 to 7 below. The light emission spectrum of the light emission devices was measured using a spectrofluorometer. FIGS. 4 to 28 each show the light emission spectrum of the light emission device in each of Examples and Comparative Examples when the light emission intensity at the light emission peak wavelength of each light emitting element is defined as 1. The correlated color temperature of the light emission device in Example 1 was 2,727 K, which was in the range of 2,000 K or more and 2,800 K or less. The melanopic ratio was derived from the spectral distribution of each light emission device, the sensitivity curve (circadian action curve) of ipRGC that was a photoreceptor in the retina of mammals, as proposed by the WELL certification, and the visual sensitivity curve in photopic vision of mammals, including humans, as specified by the International Commission on Illumination (CIE), based on the above formula (2). The melanopic ratio was calculated using an action curve defined with the sensitivity at each peak wavelength of the sensitivity curve of ipRGC and of the visual sensitivity curve in human photopic vision as 1.

Examples 2 to 4 and Comparative Example 1

Light emission devices were produced in the same manner as in Example 1 except that the types of the first fluorescent material 71, the second fluorescent material 72, and the third fluorescent material 73, as well as the content of each fluorescent material relative to the total amount of the fluorescent materials were changed as shown in Table 4 below. The light emission characteristics of each light emission device were measured in the same manner as in Example 1. The correlated color temperature of the light emission device in each of Examples and Comparative Examples was approximately 2,700 K, which was in the range of 2,000 K or more and 2,800 K or less.

TABLE 4

| | | Comparative Example 1 | Comparative Example 2 | Example 1 | Example 2 | Example 3 | Example 4 |
|---|---|---|---|---|---|---|---|
| Fluorescent material used | First fluorescent material | G-YAG1/ G-YAG2 | G-YAG2 | LAG/ G-YAG1 | G-LAG | G-LAG | G-LAG |
| | Second fluorescent material | SCASN2/ SCASN4 | SCASN4 | SCASN4 | SCASN1 | SCASN1 | SCASN1 |
| | Third fluorescent material | — | — | KSF | KSF | KSF | KSF |
| | Fourth fluorescent material | — | CMSC2 | — | SAE | SAE | SAE |
| Blending amount relative to 100 parts by mass of resin [parts by mass] | | 97.0 | 89.0 | 119.2 | 188.2 | 202.7 | 220.0 |
| Content ratio in total fluorescent material amount [% by mass] | First fluorescent material | 93.2 | 45.2 | 55.4 | 57.6 | 50.6 | 42.5 |
| | Second fluorescent material | 6.8 | 9.7 | 2.6 | 4.6 | 4.3 | 3.6 |
| | Third fluorescent material | — | — | 41.9 | 32.5 | 30.3 | 31.3 |
| | Fourth fluorescent material | — | 45.2 | — | 5.3 | 14.8 | 22.7 |
| Third fluorescent material/ (Second fluorescent material + Third fluorescent material) | | — | — | 94.1 | 87.5 | 87.5 | 90.0 |

TABLE 4-continued

|  |  | Comparative Example 1 | Comparative Example 2 | Example 1 | Example 2 | Example 3 | Example 4 |
|---|---|---|---|---|---|---|---|
| Correlated color temperature [K] | | 2707 | 2733 | 2727 | 2705 | 2706 | 2715 |
| Chromaticity coordinates | x | 0.458 | 0.458 | 0.457 | 0.458 | 0.458 | 0.457 |
| | y | 0.410 | 0.411 | 0.410 | 0.410 | 0.410 | 0.411 |
| Relative φv | | 100.0 | 87.1 | 100.1 | 105.5 | 100.8 | 97.4 |
| Color rendering indices | Ra | 83.1 | 94.0 | 95.6 | 93.2 | 92.0 | 88.9 |
| | R1 | 82.1 | 99.0 | 97.9 | 98.0 | 97.2 | 90.0 |
| | R2 | 92.5 | 99.0 | 99.4 | 97.7 | 94.9 | 90.7 |
| | R3 | 95.2 | 96.0 | 99.2 | 94.6 | 92.4 | 91.4 |
| | R4 | 80.6 | 99.0 | 98.4 | 96.5 | 95.9 | 89.0 |
| | R5 | 82.3 | 99.0 | 98.0 | 98.1 | 95.1 | 87.3 |
| | R6 | 91.7 | 92.0 | 95.3 | 90.6 | 85.9 | 79.0 |
| | R7 | 81.7 | 90.0 | 91.8 | 88.6 | 88.7 | 90.5 |
| | R8 | 58.7 | 81.0 | 84.4 | 82.1 | 85.4 | 93.3 |
| | R9 | 11.6 | 58.0 | 65.3 | 63.7 | 72.3 | 92.2 |
| | R10 | 83.2 | 97.0 | 97.0 | 95.6 | 88.8 | 78.9 |
| | R11 | 80.4 | 90.0 | 97.1 | 97.2 | 91.5 | 80.8 |
| | R12 | 74.0 | 90.0 | 87.1 | 86.0 | 80.6 | 71.3 |
| | R13 | 84.6 | 99.0 | 98.6 | 99.2 | 96.4 | 89.3 |
| | R14 | 98.2 | 98.0 | 98.2 | 98.0 | 96.7 | 96.1 |
| | R15 | 74.6 | 91.0 | 92.7 | 92.4 | 95.4 | 95.8 |
| Melanopic ratio | | 0.460 | — | 0.498 | 0.524 | 0.546 | 0.578 |

Examples 5 to 9 and Comparative Examples 3 to 4

Light emission devices were produced in the same manner as in Example 1 except that the first fluorescent material 71, the second fluorescent material 72, and the third fluorescent material 73 were blended such that the chromaticity coordinates in CIE 1931 were located in the vicinity of x=0.434 and y=0.403; and the types of the first fluorescent material 71, the second fluorescent material 72, and the third fluorescent material 73, as well as the content of each fluorescent material relative to the total amount of the fluorescent materials were changed as shown in Table 5 below. The light emission characteristics of each light emission device were measured in the same manner as in Example 1. The correlated color temperature of the light emission device in each of Examples and Comparative Examples was approximately 3,000 K, which was in the range of 2,800 K or more and less than 3,500 K.

TABLE 5

|  |  | Comparative Example 3 | Comparative Example 4 | Example 5 | Example 6 | Example 7 | Example 8 | Example 9 |
|---|---|---|---|---|---|---|---|---|
| Fluorescent material used | First fluorescent material | G-YAG1/ G-YAG2 | G-YAG2 | LAG/ G-YAG1 | G-LAG | G-LAG | G-LAG | G-LAG |
| | Second fluorescent material | SCASN2/ SCASN4 | SCASN4 | SCASN2 | SCASN1 | SCASN1 | SCASN1 | SCASN2 |
| | Third fluorescent material | — | — | KSF | KSF | KSF | KSF | KSF |
| | Fourth fluorescent material | — | CMSC2 | — | SAE | SAE | SAE | SAE |
| Blending amount relative to 100 parts by mass of resin [parts by mass] | | 86.9 | 81.0 | 105.0 | 174.1 | 177.1 | 177.5 | 190.0 |
| Content ratio in total fluorescent material amount [% by mass] | First fluorescent material | 94.2 | 55.0 | 49.0 | 59.2 | 50.6 | 47.1 | 40.5 |
| | Second fluorescent material | 5.8 | 8.4 | 3.4 | 4.4 | 4.1 | 4.9 | 3.3 |
| | Third fluorescent material | — | — | 47.6 | 30.7 | 28.4 | 19.8 | 29.8 |
| | Fourth fluorescent material | — | 36.6 | — | 5.7 | 16.9 | 26.2 | 26.3 |
| Third fluorescent material/ (Second fluorescent material + Third fluorescent material) | | — | — | 93.3 | 87.5 | 87.5 | 80 | 90 |
| Correlated color temperature [K] | | 3023 | 2996 | 3007 | 3023 | 3024 | 3027 | 3030 |

TABLE 5-continued

|  |  | Comparative Example 3 | Comparative Example 4 | Example 5 | Example 6 | Example 7 | Example 8 | Example 9 |
|---|---|---|---|---|---|---|---|---|
| Chromaticity coordinates | x | 0.434 | 0.437 | 0.434 | 0.434 | 0.434 | 0.434 | 0.434 |
|  | y | 0.403 | 0.404 | 0.402 | 0.403 | 0.403 | 0.403 | 0.404 |
| Relative φv |  | 100.0 | 85.9 | 104.1 | 102.9 | 99.5 | 99.5 | 96.2 |
| Color rendering indices | Ra | 83.8 | 94.0 | 95.1 | 94.2 | 92.1 | 90.1 | 87.5 |
|  | R1 | 82.6 | 95.0 | 97.1 | 98.6 | 95.5 | 97.7 | 86.6 |
|  | R2 | 91.8 | 97.0 | 97.9 | 97.6 | 94.1 | 95.0 | 89.0 |
|  | R3 | 96.5 | 98.0 | 96.6 | 95.7 | 92.9 | 88.0 | 91.3 |
|  | R4 | 81.7 | 91.0 | 97.0 | 96.6 | 94.8 | 93.3 | 86.3 |
|  | R5 | 82.6 | 94.0 | 96.4 | 97.6 | 93.8 | 96.3 | 84.7 |
|  | R6 | 89.6 | 90.0 | 96.2 | 91.6 | 86.2 | 86.6 | 78.1 |
|  | R7 | 83.8 | 94.0 | 93.2 | 90.4 | 90.0 | 84.9 | 91.2 |
|  | R8 | 61.9 | 89.0 | 86.5 | 85.6 | 89.1 | 78.1 | 93.1 |
|  | R9 | 14.1 | 75.0 | 67.7 | 70.3 | 80.9 | 58.1 | 90.8 |
|  | R10 | 80.9 | 92.0 | 92.7 | 95.6 | 87.2 | 87.8 | 75.0 |
|  | R11 | 81.0 | 82.0 | 97.2 | 97.2 | 90.9 | 95.0 | 78.3 |
|  | R12 | 69.0 | 91.0 | 80.9 | 84.9 | 80.6 | 79.5 | 71.4 |
|  | R13 | 84.9 | 94.0 | 97.3 | 99.2 | 94.8 | 98.2 | 86.3 |
|  | R14 | 98.9 | 98.0 | 96.7 | 98.5 | 96.8 | 94.0 | 95.9 |
|  | R15 | 75.9 | 97.0 | 93.3 | 94.3 | 97.1 | 91.2 | 91.3 |
| Melanopic ratio |  | 0.523 | — | 0.548 | 0.599 | 0.628 | 0.633 | 0.661 |

Examples 10 to 13 and Comparative Examples 5 to 6

Light emission devices were produced in the same manner as in Example 1 except that the first fluorescent material 71, the second fluorescent material 72, and the third fluorescent material 73 were blended such that the chromaticity coordinates in CIE 1931 were located in the vicinity of x=0.382 and y=0.380; and the types of the first fluorescent material 71, the second fluorescent material 72, and the third fluorescent material 73, as well as the content of each fluorescent material relative to the total amount of the fluorescent materials were changed as shown in Table 6 below. The light emission characteristics of each light emission device were measured in the same manner as in Example 1. The correlated color temperature of the light emission device in each of Examples and Comparative Examples was approximately 4,000 K, which was in the range of 3,500 K or more and less than 4,500 K.

TABLE 6

|  |  | Comparative Example 5 | Comparative Example 6 | Example 10 | Example 11 | Example 12 | Example 13 |
|---|---|---|---|---|---|---|---|
| Fluorescent material used | First fluorescent material | G-YAG1/G-YAG2 | G-YAG2 | G-YAG2 | G-LAG | G-LAG | G-LAG |
|  | Second fluorescent material | SCASN2/SCASN4 | SCASN4 | SCASN1 | SCASN1 | SCASN1 | SCASN1 |
|  | Third fluorescent material | — | — | KSF | KSF | KSF | KSF |
|  | Fourth fluorescent material | — | CMSC2 | — | SAE | SAE | SAE |
| Blending amount relative to 100 parts by mass of resin [parts by mass] |  | 57.5 | 56.0 | 76.9 | 127.6 | 134.1 | 139.1 |
| Content ratio in total fluorescent material amount [% by mass] | First fluorescent material | 95.5 | 36.5 | 48.1 | 57.8 | 51.5 | 42.4 |
|  | Second fluorescent material | 4.5 | 8.7 | 2.6 | 2.6 | 3.3 | 3.8 |
|  | Third fluorescent material | — | — | 49.3 | 31.7 | 22.8 | 17.9 |
|  | Fourth fluorescent material | — | 54.6 | — | 7.8 | 22.4 | 35.9 |
| Third fluorescent material/(Second fluorescent material + Third fluorescent material) |  | — | — | 95.0 | 92.5 | 87.5 | 82.5 |
| Correlated color temperature [K] |  | 3961 | 4012 | 3944 | 3962 | 3961 | 3960 |

TABLE 6-continued

|  |  | Comparative Example 5 | Comparative Example 6 | Example 10 | Example 11 | Example 12 | Example 13 |
|---|---|---|---|---|---|---|---|
| Chromaticity coordinates | x | 0.382 | 0.381 | 0.383 | 0.382 | 0.382 | 0.382 |
|  | y | 0.380 | 0.379 | 0.380 | 0.380 | 0.380 | 0.380 |
| Relative φv |  | 100.0 | 87.2 | 106.2 | 98.9 | 97.2 | 95.8 |
| Color rendering indices | Ra | 83.4 | 92.0 | 94.0 | 92.6 | 91.7 | 89.5 |
|  | R1 | 81.9 | 93.0 | 96.7 | 90.1 | 92.6 | 92.9 |
|  | R2 | 89.6 | 96.0 | 94.0 | 94.0 | 92.7 | 91.0 |
|  | R3 | 94.6 | 98.0 | 88.6 | 98.0 | 93.3 | 88.5 |
|  | R4 | 81.8 | 93.0 | 95.4 | 91.4 | 92.4 | 90.8 |
|  | R5 | 81.5 | 92.0 | 94.4 | 91.2 | 92.2 | 91.5 |
|  | R6 | 84.7 | 94.0 | 90.9 | 89.7 | 87.3 | 84.4 |
|  | R7 | 86.6 | 92.0 | 96.6 | 94.7 | 90.7 | 87.1 |
|  | R8 | 66.2 | 80.0 | 95.3 | 91.1 | 92.5 | 88.7 |
|  | R9 | 15.1 | 50.0 | 82.5 | 81.7 | 94.6 | 88.4 |
|  | R10 | 74.5 | 90.0 | 82.7 | 88.3 | 84.2 | 79.4 |
|  | R11 | 80.4 | 94.0 | 93.8 | 87.7 | 90.5 | 90.2 |
|  | R12 | 57.8 | 67.0 | 65.8 | 80.7 | 78.3 | 75.8 |
|  | R13 | 83.9 | 94.0 | 95.5 | 90.8 | 92.1 | 91.7 |
|  | R14 | 97.1 | 99.0 | 92.4 | 97.6 | 96.6 | 94.0 |
|  | R15 | 76.4 | 88.0 | 95.9 | 90.1 | 93.8 | 94.6 |
| Melanopic ratio |  | 0.679 | — | 0.686 | 0.804 | 0.826 | 0.848 |

Examples 14 to 21 and Comparative Examples 7 to 8

Light emission devices were produced in the same manner as in Example 1 except that the first fluorescent material 71, the second fluorescent material 72, and the third fluorescent material 73 were blended such that the chromaticity coordinates in CIE 1931 were located in the vicinity of x=0.345 and y=0.355; and the types of the first fluorescent material 71, the second fluorescent material 72, and the third fluorescent material 73, as well as the content of each fluorescent material relative to the total amount of the fluorescent materials were changed as shown in Table 7 below. The light emission characteristics of each light emission device were measured in the same manner as in Example 1. The correlated color temperature of the light emission device in each of Examples and Comparative Examples was approximately 5,000 K, which was in the range of 4,500 K or more and less than 5,700 K.

TABLE 7

|  |  | Comparative Example 7 | Comparative Example 8 | Example 14 | Example 15 | Example 16 | Example 17 |
|---|---|---|---|---|---|---|---|
| Fluorescent material used | First fluorescent material | G-YAG1/ YAG | G-YAG2 | LAG/ G-YAG1 | G-LAG | G-LAG | G-LAG |
|  | Second fluorescent material | SCASN2/ SCASN3 | SCASN4 | SCASN1 | SCASN1 | SCASN1 | SCASN1 |
|  | Third fluorescent material | — | — | KSF | KSF | KSF | KSF |
|  | Fourth fluorescent material | SAE | CMSC2 | — | — | — | SAE |
| Blending amount relative to 100 parts by mass of resin [parts by mass] |  | 45.5 | 41.0 | 63.9 | 102.8 | 93.4 | 105.3 |
| Content ratio in total fluorescent material amount [% by mass] | First fluorescent material | 79.1 | 66.2 | 63.4 | 68.3 | 75.0 | 64.9 |
|  | Second fluorescent material | 3.3 | 8.0 | 1.8 | 1.6 | 2.5 | 2.6 |
|  | Third fluorescent material | — | — | 34.7 | 30.1 | 22.5 | 23.1 |
|  | Fourth fluorescent material | 17.6 | 36.8 | — | — | — | 9.5 |
| Third fluorescent material/ (Second fluorescent material + Third fluorescent material) |  | — | — | 95.0 | 95.0 | 90.0 | 90.0 |
| Correlated color temperature [K] |  | 5001 | 4928 | 5000 | 5000 | 5000 | 4999 |

TABLE 7-continued

| | | | | | | |
|---|---|---|---|---|---|---|
| Chromaticity | x | 0.345 | 0.348 | 0.345 | 0.345 | 0.345 | 0.345 |
| coordinates | y | 0.354 | 0.363 | 0.354 | 0.354 | 0.354 | 0.354 |
| Relative φv | | 100.0 | 84.1 | 98.5 | 94.9 | 97.2 | 94.6 |
| Color rendering indices | Ra | 83.7 | 93.0 | 96.8 | 92.5 | 96.6 | 93.6 |
| | R1 | 82.5 | 95.0 | 98.6 | 90.1 | 97.8 | 92.6 |
| | R2 | 89.5 | 94.0 | 97.4 | 95.4 | 99.0 | 94.4 |
| | R3 | 93.3 | 94.0 | 92.1 | 95.6 | 98.5 | 98.0 |
| | R4 | 83.1 | 95.0 | 98.9 | 92.3 | 96.3 | 93.3 |
| | R5 | 82.6 | 94.0 | 96.3 | 92.7 | 96.2 | 93.6 |
| | R6 | 84.1 | 92.0 | 93.3 | 93.7 | 95.2 | 92.3 |
| | R7 | 86.7 | 96.0 | 99.6 | 94.3 | 95.3 | 92.8 |
| | R8 | 67.0 | 88.0 | 98.4 | 85.9 | 94.8 | 91.8 |
| | R9 | 10.5 | 62.0 | 96.5 | 66.0 | 91.7 | 84.9 |
| | R10 | 74.2 | 86.0 | 90.8 | 92.3 | 99.1 | 89.3 |
| | R11 | 82.7 | 93.0 | 96.0 | 89.8 | 98.7 | 93.5 |
| | R12 | 57.5 | 66.0 | 65.1 | 75.3 | 71.5 | 72.7 |
| | R13 | 84.7 | 95.0 | 98.6 | 91.2 | 98.4 | 92.6 |
| | R14 | 96.6 | 96.0 | 94.7 | 96.1 | 98.3 | 98.0 |
| | R15 | 77.1 | 90.0 | 95.7 | 86.7 | 94.9 | 90.3 |
| Melanopic ratio | | 0.830 | — | 0.879 | 0.943 | 0.921 | 0.961 |

| | | | Example 18 | Example 19 | Example 20 | Example 21 |
|---|---|---|---|---|---|---|
| Fluorescent material used | First fluorescent material | | G-LAG | G-LAG | G-LAG | G-LAG |
| | Second fluorescent material | | SCASN1 | SCASN1 | SCASN1 | SCASN1 |
| | Third fluorescent material | | KSF | KSF | KSF | KSF |
| | Fourth fluorescent material | | SAE | SAE | SAE | CMSC1 |
| Blending amount relative to 100 parts by mass of resin [parts by mass] | | | 108.2 | 115.0 | 109.4 | 85.0 |
| Content ratio in total fluorescent material amount [% by mass] | First fluorescent material | | 57.8 | 51.7 | 37.9 | 59.9 |
| | Second fluorescent material | | 3.0 | 3.3 | 3.7 | 4.3 |
| | Third fluorescent material | | 20.7 | 18.8 | 12.7 | 24.1 |
| | Fourth fluorescent material | | 18.5 | 26.1 | 45.7 | 11.8 |
| Third fluorescent material/ (Second fluorescent material + Third fluorescent material) | | | 87.5 | 85.0 | 77.5 | 85.0 |
| Correlated color temperature [K] | | | 5000 | 4970 | 4997 | 5004 |
| Chromaticity coordinates | x | | 0.345 | 0.346 | 0.345 | 0.345 |
| | y | | 0.354 | 0.355 | 0.355 | 0.355 |
| Relative φv | | | 93.2 | 92.4 | 89.4 | 93.8 |
| Color rendering indices | Ra | | 92.3 | 91.5 | 87.2 | 95.2 |
| | R1 | | 92.4 | 92.2 | 91.3 | 93.3 |
| | R2 | | 93.1 | 92.2 | 88.8 | 96.1 |
| | R3 | | 95.1 | 92.8 | 85.4 | 98.6 |
| | R4 | | 92.0 | 92.3 | 87.3 | 94.5 |
| | R5 | | 92.8 | 92.2 | 90.2 | 94.3 |
| | R6 | | 90.3 | 88.1 | 83.7 | 91.9 |
| | R7 | | 91.0 | 90.4 | 84.3 | 96.7 |
| | R8 | | 91.9 | 92.1 | 86.8 | 96.7 |
| | R9 | | 90.5 | 93.5 | 91.5 | 95.7 |
| | R10 | | 85.7 | 82.9 | 73.6 | 91.7 |
| | R11 | | 92.7 | 91.7 | 89.9 | 88.0 |
| | R12 | | 73.5 | 77.0 | 72.3 | 83.2 |
| | R13 | | 91.8 | 91.6 | 89.5 | 93.8 |
| | R14 | | 97.2 | 96.1 | 91.9 | 98.3 |
| | R15 | | 90.9 | 92.3 | 91.4 | 95.1 |
| Melanopic ratio | | | 0.978 | 0.987 | 1.032 | 0.948 |

Examples 22 to 25 and Comparative Examples 9 to 10

Light emission devices were produced in the same manner as in Example 1 except that the first fluorescent material 71, the second fluorescent material 72, and the third fluorescent material 73 were blended such that the chromaticity coordinates in CIE 1931 were located in the vicinity of x=0.312 and y=0.328; and the types of the first fluorescent material 71, the second fluorescent material 72, and the third fluorescent material 73, as well as the content of each fluorescent material relative to the total amount of the fluorescent materials were changed as shown in Table 8 below. The light emission characteristics of each light emission device were measured in the same manner as in Example 1. The correlated color temperature of the light emission device in each of Examples and Comparative Examples was approximately 6,500 K, which was in the range of 5,700 K or more and less than 7,200 K.

TABLE 8

| | | Comparative Example 9 | Comparative Example 10 | Example 22 | Example 23 | Example 24 | Example 25 |
|---|---|---|---|---|---|---|---|
| Fluorescent material used | First fluorescent material | G-YAG1/YAG | G-YAG2 | LAG/G-YAG1 | G-LAG | G-LAG | G-LAG |
| | Second fluorescent material | SCASN2/SCASN3 | SCASN4 | SCASN1 | SCASN1 | SCASN1 | SCASN1 |
| | Third fluorescent material | — | — | KSF | KSF | KSF | KSF |
| | Fourth fluorescent material | SAE | CMSC2 | — | SAE | SAE | SAE |
| Blending amount relative to 100 parts by mass of resin [parts by mass] | | 30.7 | 22.5 | 54.3 | 80.9 | 85.0 | 91.5 |
| Content ratio in total fluorescent material amount [% by mass] | First fluorescent material | 77.7 | 63.2 | 68.9 | 73.4 | 51.8 | 30.1 |
| | Second fluorescent material | 2.7 | 7.0 | 1.6 | 2.9 | 3.2 | 3.0 |
| | Third fluorescent material | — | — | 29.5 | 11.4 | 9.7 | 12.2 |
| | Fourth fluorescent material | 19.5 | 29.8 | — | 12.4 | 35.3 | 54.6 |
| Third fluorescent material/(Second fluorescent material + Third fluorescent material) | | — | — | 95.0 | 80.0 | 75 | 80 |
| Correlated color temperature [K] | | 6521 | 6547 | 6532 | 6520 | 6532 | 6521 |
| Chromaticity coordinates | x | 0.312 | 0.312 | 0.312 | 0.312 | 0.312 | 0.312 |
| | y | 0.328 | 0.328 | 0.329 | 0.328 | 0.329 | 0.328 |
| Relative φv | | 100.0 | 86.0 | 99.4 | 96.3 | 92.1 | 87.5 |
| Color rendering indices | Ra | 84.6 | 91.0 | 94.6 | 94.3 | 90.2 | 83.2 |
| | R1 | 83.8 | 92.0 | 96.3 | 96.5 | 93.1 | 83.6 |
| | R2 | 89.6 | 92.0 | 94.9 | 97.8 | 91.5 | 83.5 |
| | R3 | 91.5 | 91.0 | 90.4 | 96.9 | 89.4 | 82.8 |
| | R4 | 84.5 | 93.0 | 96.0 | 93.3 | 90.1 | 83.8 |
| | R5 | 83.5 | 91.0 | 94.3 | 94.8 | 92.6 | 84.7 |
| | R6 | 83.3 | 88.0 | 90.2 | 93.9 | 88.7 | 78.9 |
| | R7 | 88.8 | 94.0 | 97.8 | 92.0 | 87.6 | 83.3 |
| | R8 | 72.0 | 86.0 | 97.2 | 89.4 | 88.9 | 85.3 |
| | R9 | 17.1 | 55.0 | 88.6 | 79.0 | 91.8 | 71.2 |
| | R10 | 73.6 | 81.0 | 85.4 | 96.6 | 80.4 | 60.9 |
| | R11 | 84.3 | 92.0 | 94.2 | 97.3 | 93.2 | 83.5 |
| | R12 | 54.6 | 60.0 | 64.1 | 71.7 | 74.8 | 71.7 |
| | R13 | 85.9 | 93.0 | 96.1 | 98.8 | 92.0 | 81.9 |
| | R14 | 95.7 | 95.0 | 94.3 | 98.4 | 93.9 | 90.0 |
| | R15 | 79.4 | 89.0 | 95.6 | 93.8 | 92.2 | 83.3 |
| Melanopic ratio | | 0.992 | — | 1.027 | 1.108 | 1.177 | 1.249 |

As shown in Tables 4 to 8, it was confirmed that, by combining the light emitting element having a light emission peak at 450 nm with the first fluorescent material, the second fluorescent material, and the third fluorescent material, the light emission devices in Examples 1, 5, 10, 14 to 16, and 22 each showed a higher MR value than that of the light emission devices in each Comparative Example.

As shown in Tables 4 to 8, it was confirmed that, by combining the light emitting element having a light emission peak at 450 nm with the first fluorescent material, the second fluorescent material, the third fluorescent material, and the fourth fluorescent material, the light emission devices in Examples 2 to 4, 6 to 9, 11 to 13, 17 to 21, and 23 to 25 each showed a higher MR value than that of the light emission devices in each Comparative Example.

The light emission devices in Examples 1 to 3, 5 to 8, 10 to 12, 14 to 19, 21, and 22 to 24 each had an average color rendering index Ra of 90 or more, a special color rendering index R9 of 50 or more, and a special color rendering index R15 of 85 or more. It was further confirmed that the light emission devices in Examples 4, 9, 13, 20, and 25 each had high color rendering properties with an average color rendering index Ra of 80 or more and a special color rendering index R9 of 50 or more. It was also confirmed that the decrease in efficiency was suppressed in Examples, compared to Comparative Examples.

Figure 2:
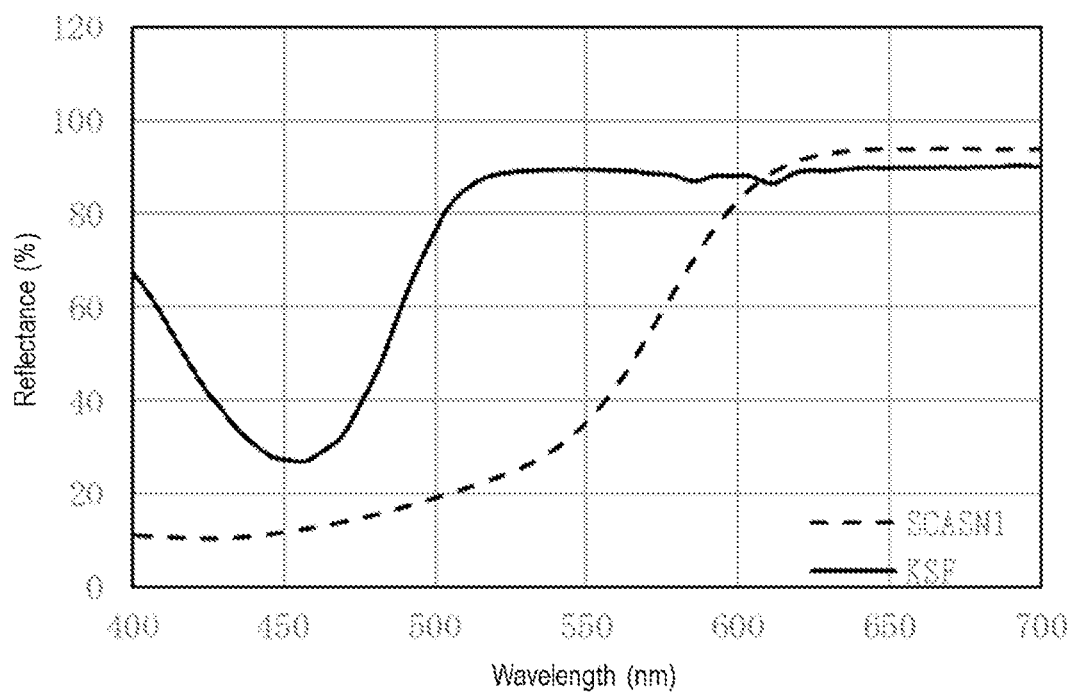
FIG. 2 is an exemplary graph showing reflection spectra of a second fluorescent material and a third fluorescent material.
Figure 3:
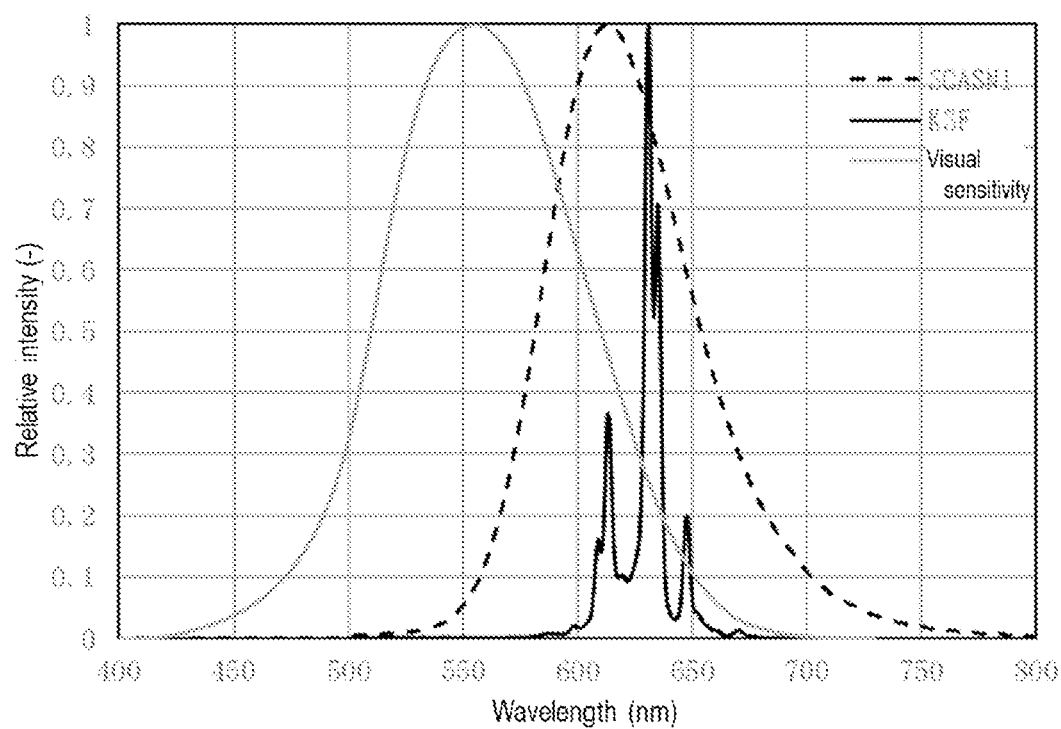
FIG. 3 is an exemplary graph showing light emission spectra of a second fluorescent material and a third fluorescent material, and a visual sensitivity spectrum.
Figure 4:
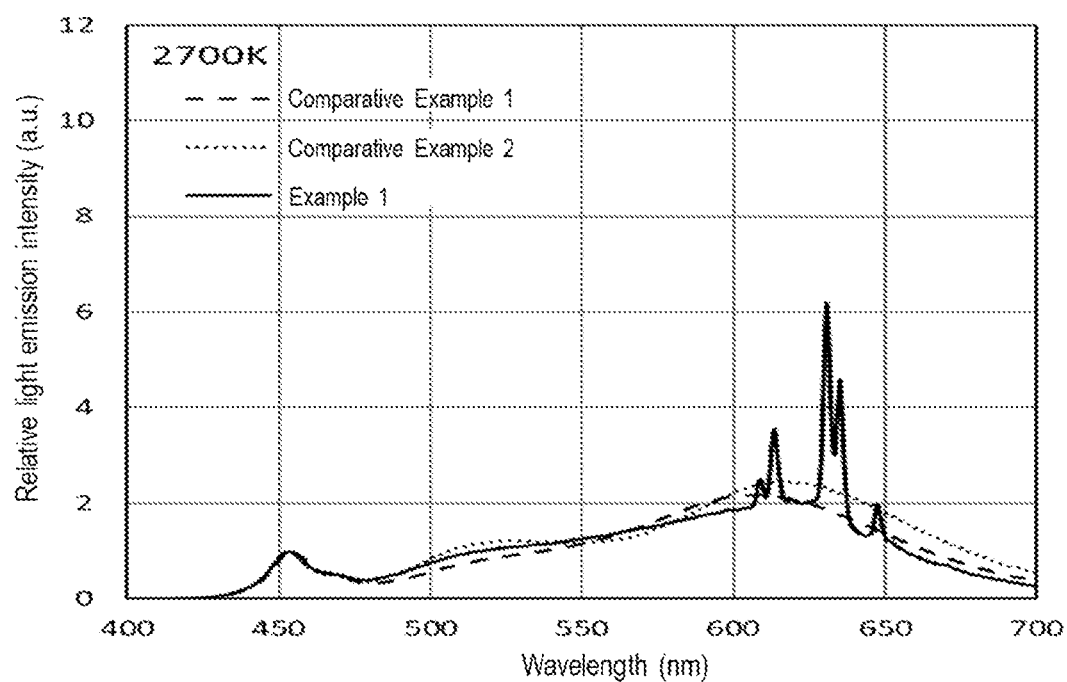
FIG. 4 is an exemplary graph showing a light emission spectrum of a light emission device according to Example 1, and light emission spectra of light emission devices according to Comparative Examples 1 and 2.
Figure 5:
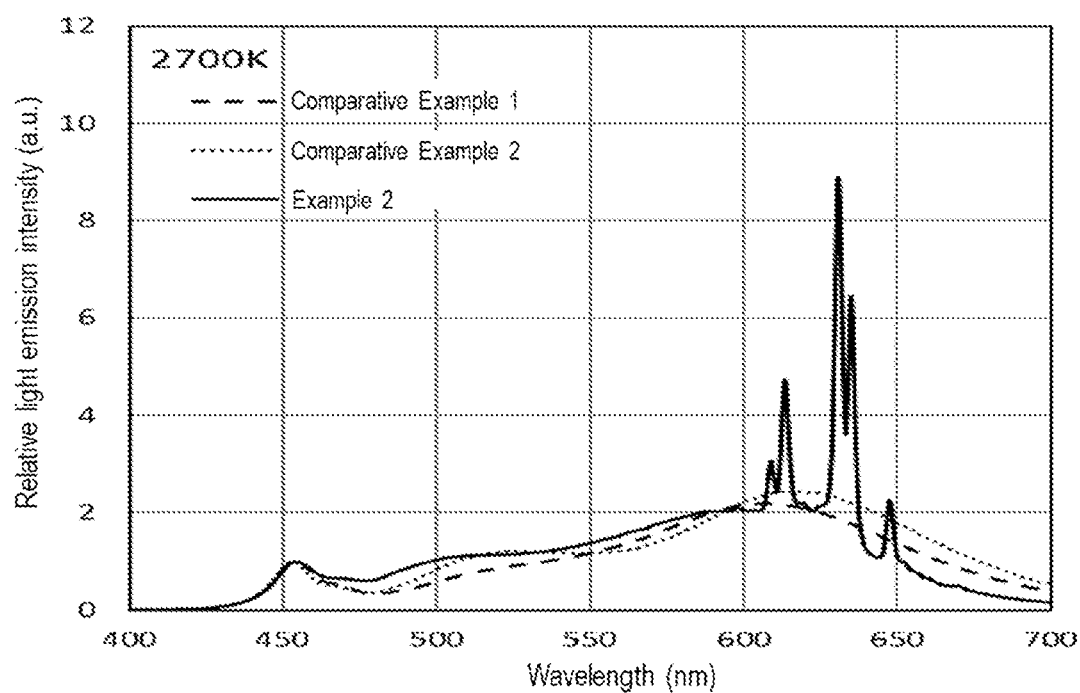
FIG. 5 is an exemplary graph showing a light emission spectrum of a light emission device according to Example 2, and light emission spectra of light emission devices according to Comparative Examples 1 and 2.
Figure 6:
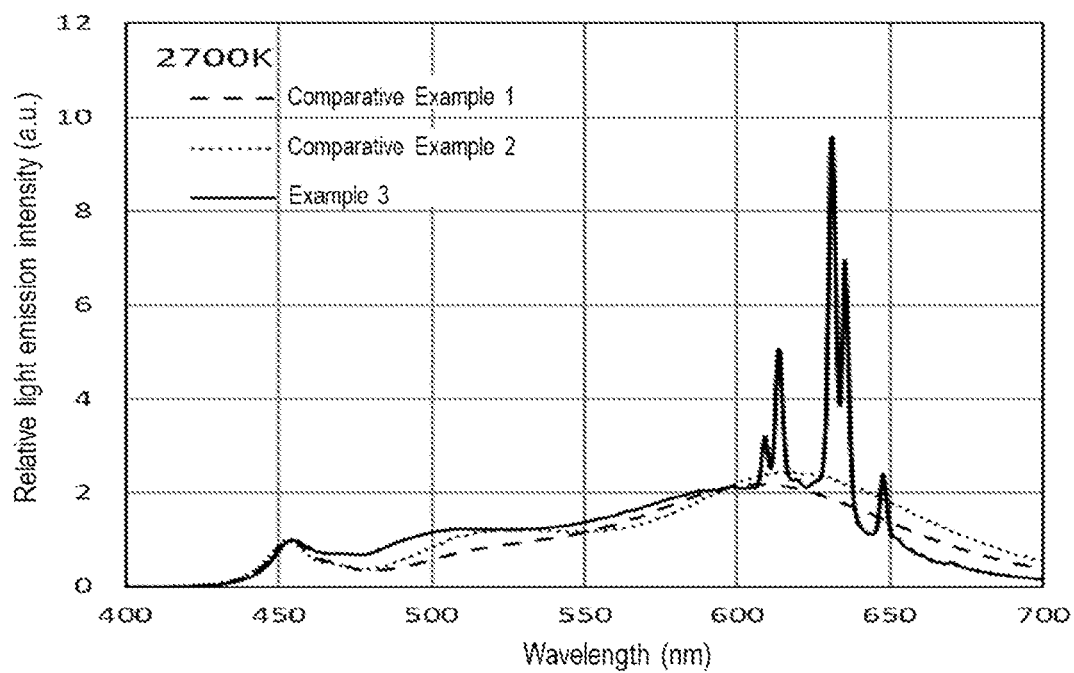
FIG. 6 is an exemplary graph showing a light emission spectrum of a light emission device according to Example 3, and light emission spectra of light emission devices according to Comparative Examples 1 and 2.
Figure 7:
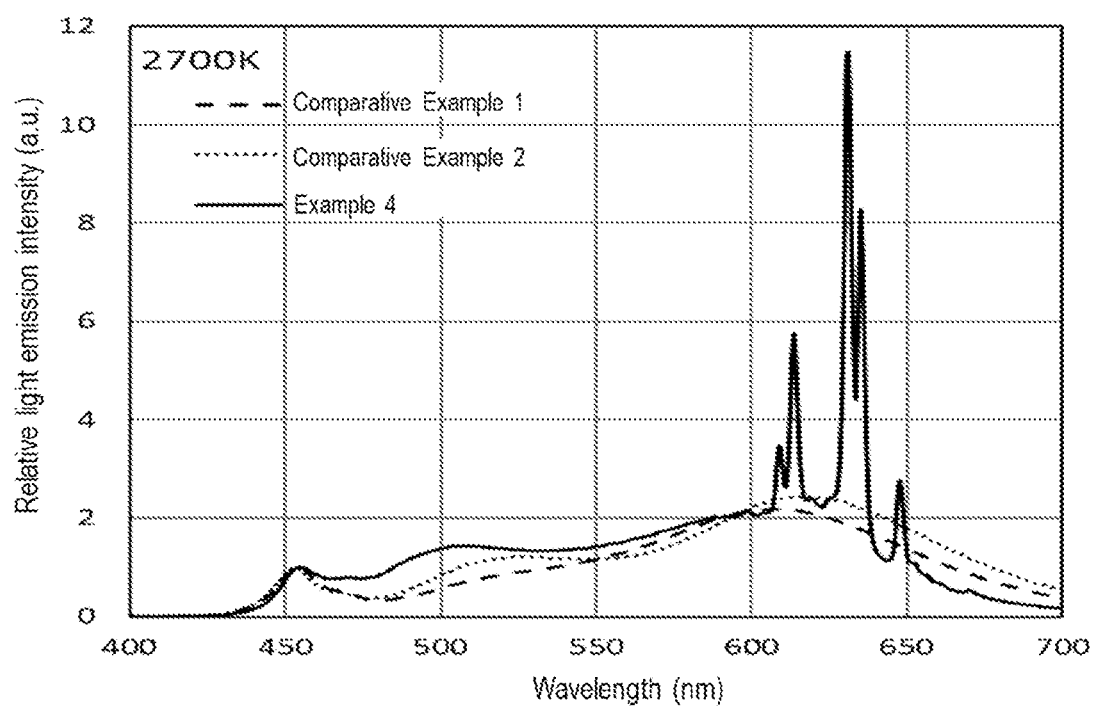
FIG. 7 is an exemplary graph showing a light emission spectrum of a light emission device according to Example 4, and light emission spectra of light emission devices according to Comparative Examples 1 and 2.
Figure 8:
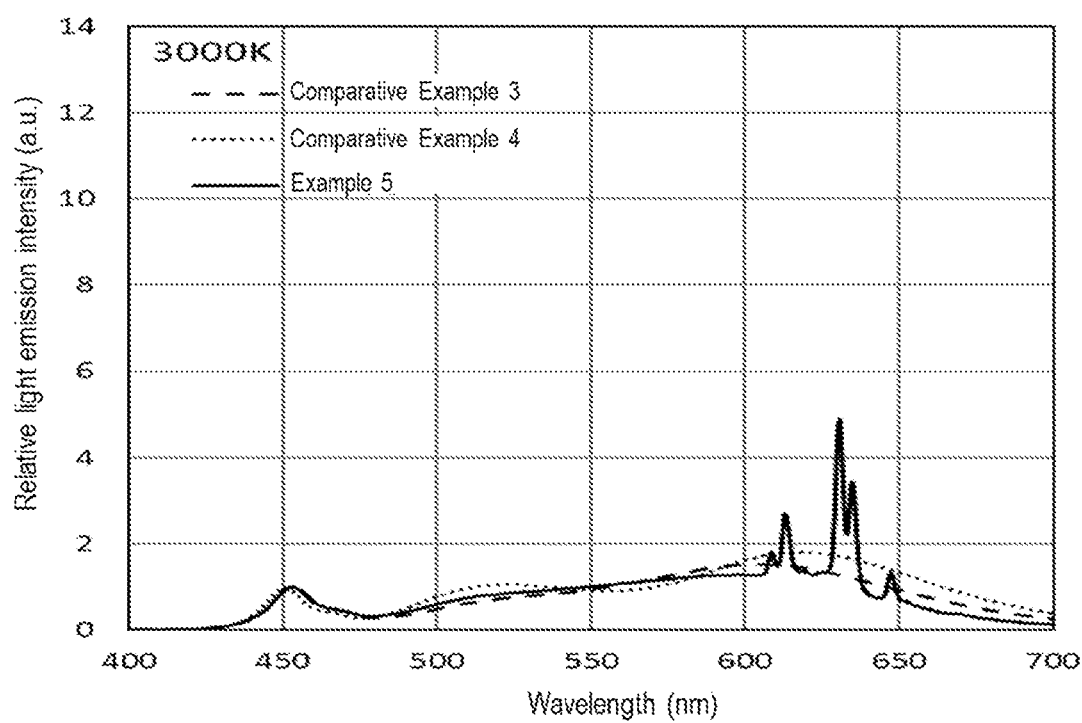
FIG. 8 is an exemplary graph showing a light emission spectrum of a light emission device according to Example 5, and light emission spectra of light emission devices according to Comparative Examples 3 and 4.
Figure 9:
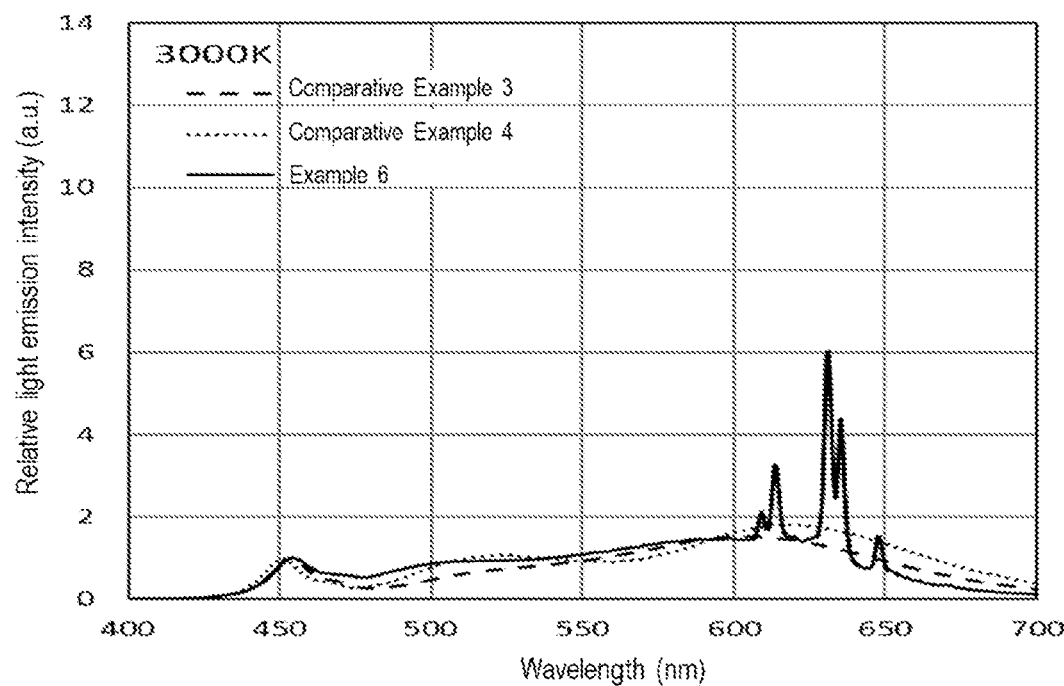
FIG. 9 is an exemplary graph showing a light emission spectrum of a light emission device according to Example 6, and light emission spectra of light emission devices according to Comparative Examples 3 and 4.
Figure 10:
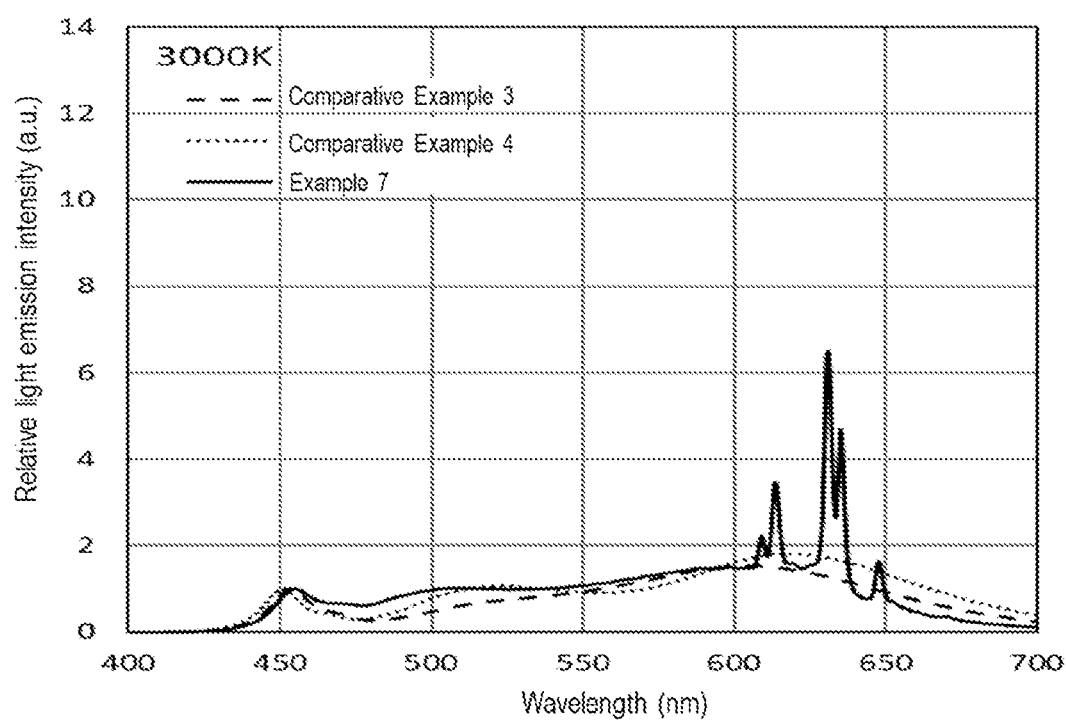
FIG. 10 is an exemplary graph showing a light emission spectrum of a light emission device according to Example 7, and light emission spectra of light emission devices according to Comparative Examples 3 and 4.
Figure 11:
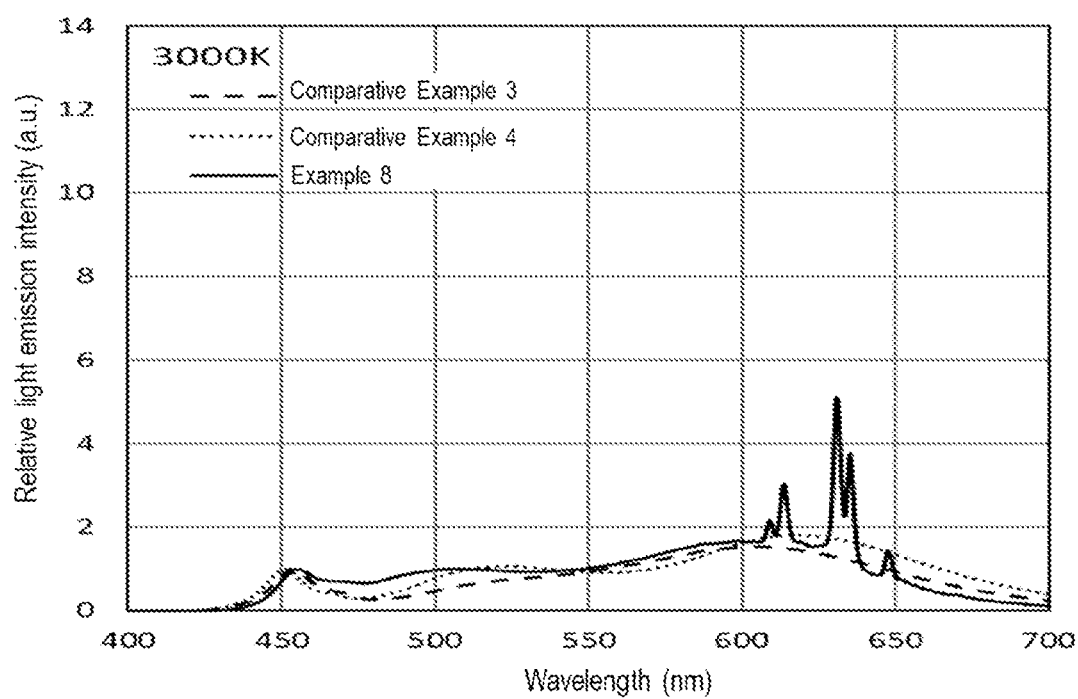
FIG. 11 is an exemplary graph showing a light emission spectrum of a light emission device according to Example 8, and light emission spectra of light emission devices according to Comparative Examples 3 and 4.
Figure 12:
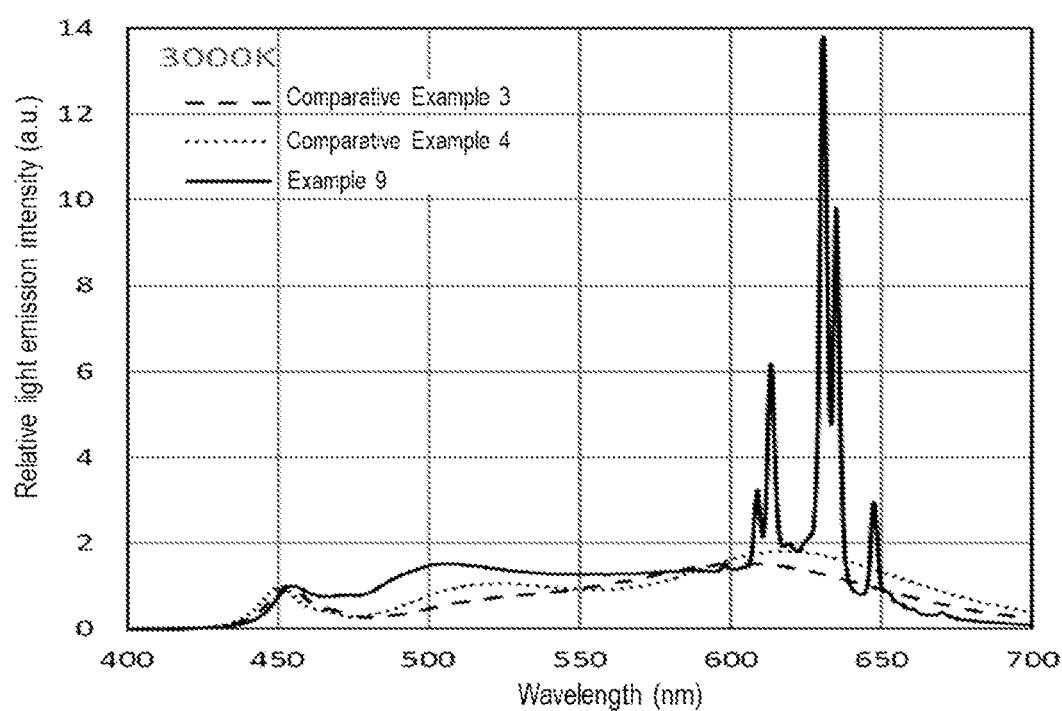
FIG. 12 is an exemplary graph showing a light emission spectrum of a light emission device according to Example 9, and light emission spectra of light emission devices according to Comparative Examples 3 and 4.
Figure 13:
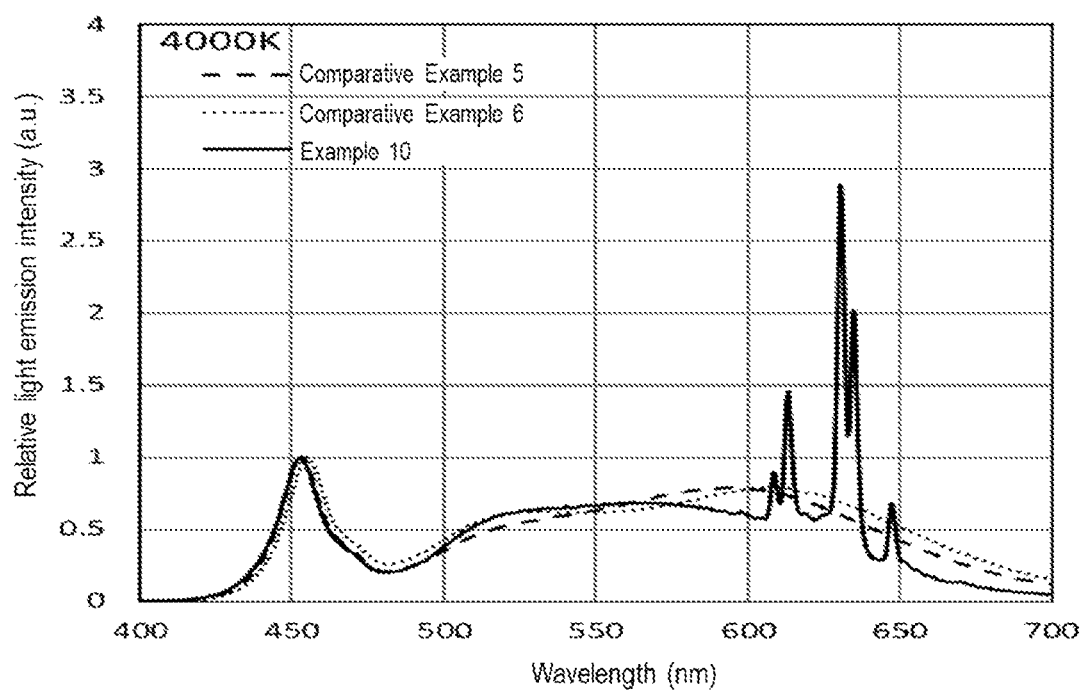
FIG. 13 is an exemplary graph showing a light emission spectrum of a light emission device according to Example 10, and light emission spectra of light emission devices according to Comparative Examples 5 and 6.
Figure 14:
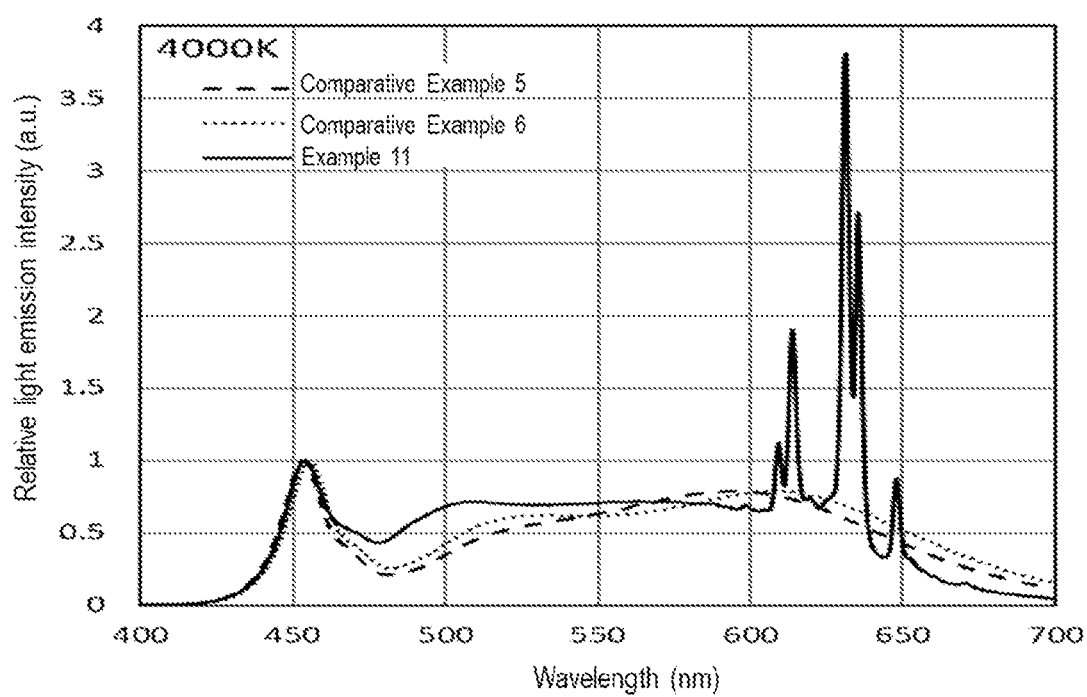
FIG. 14 is an exemplary graph showing a light emission spectrum of a light emission device according to Example 11, and light emission spectra of light emission devices according to Comparative Examples 5 and 6.
Figure 15:
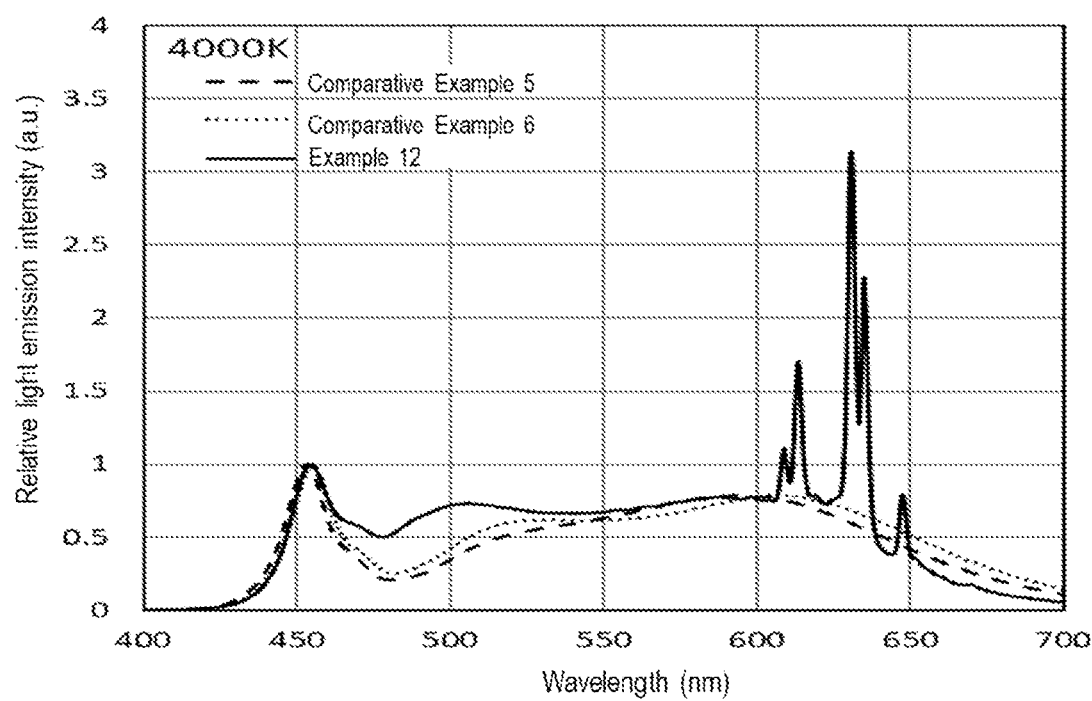
FIG. 15 is an exemplary graph showing a light emission spectrum of a light emission device according to Example 12, and light emission spectra of light emission devices according to Comparative Examples 5 and 6.
Figure 16:
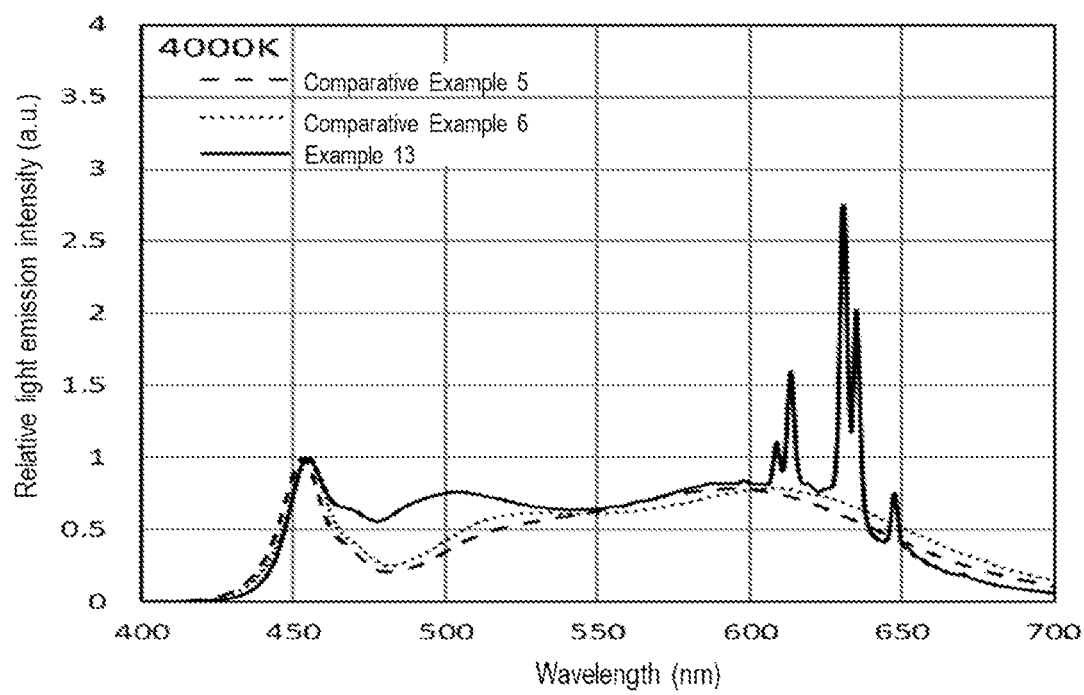
FIG. 16 is an exemplary graph showing a light emission spectrum of a light emission device according to Example 13, and light emission spectra of light emission devices according to Comparative Examples 5 and 6.
Figure 17:
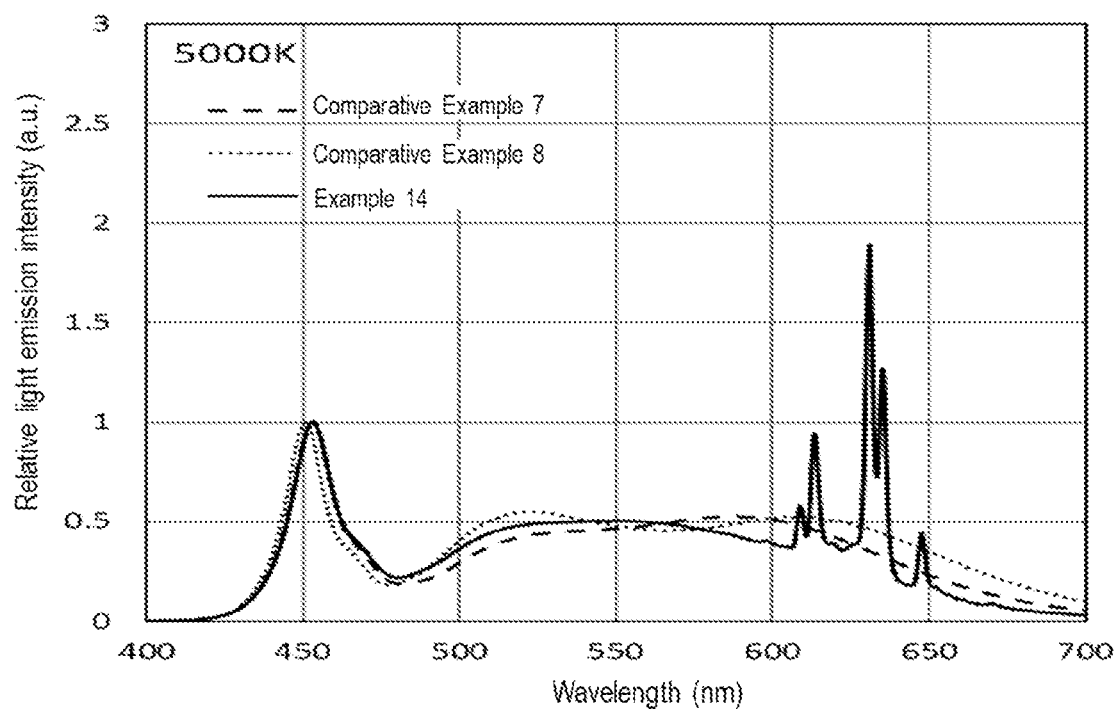
FIG. 17 is an exemplary graph showing a light emission spectrum of a light emission device according to Example 14, and light emission spectra of light emission devices according to Comparative Examples 7 and 8.
Figure 18:
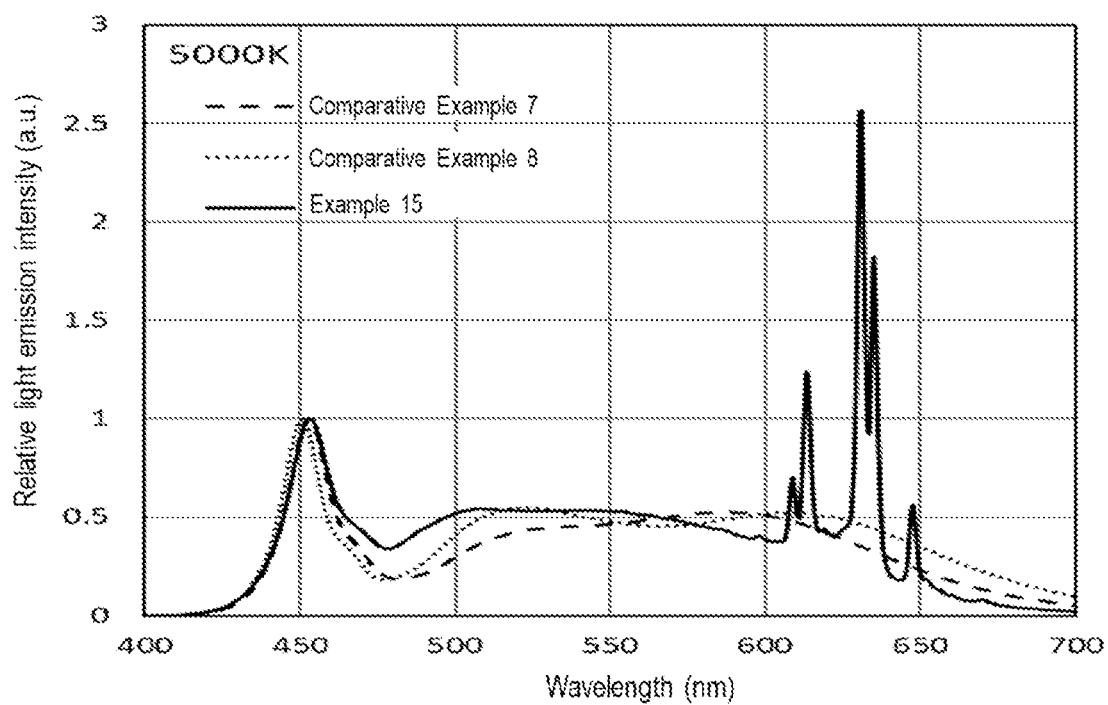
FIG. 18 is an exemplary graph showing a light emission spectrum of a light emission device according to Example 15, and light emission spectra of light emission devices according to Comparative Examples 7 and 8.
Figure 19:
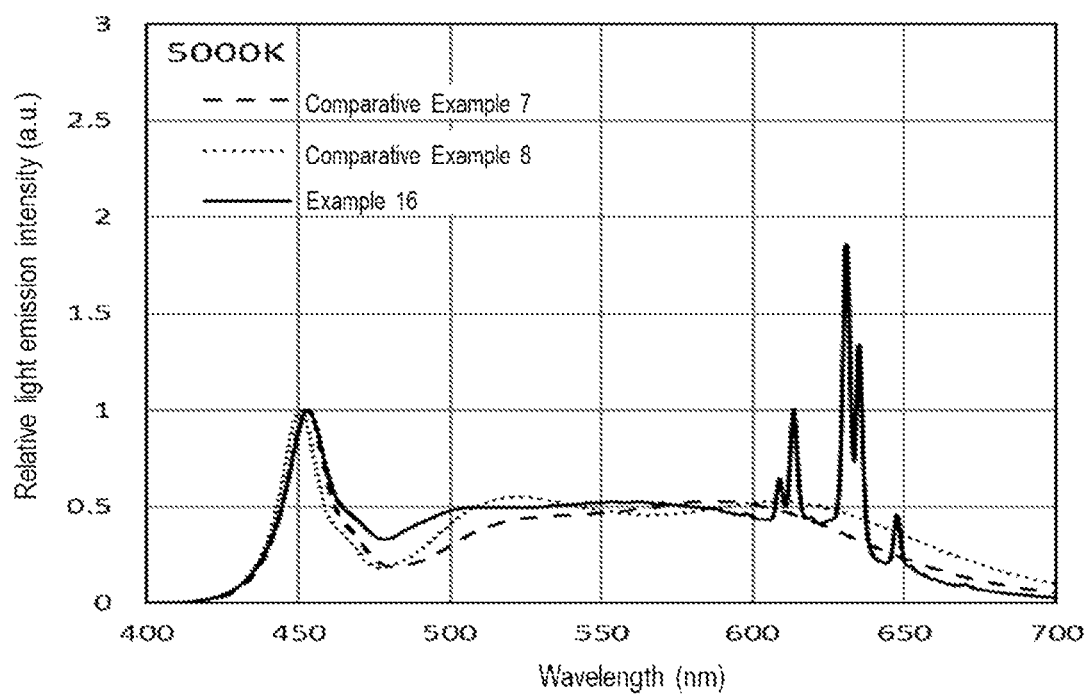
FIG. 19 is an exemplary graph showing a light emission spectrum of a light emission device according to Example 16, and light emission spectra of light emission devices according to Comparative Examples 7 and 8.
Figure 20:
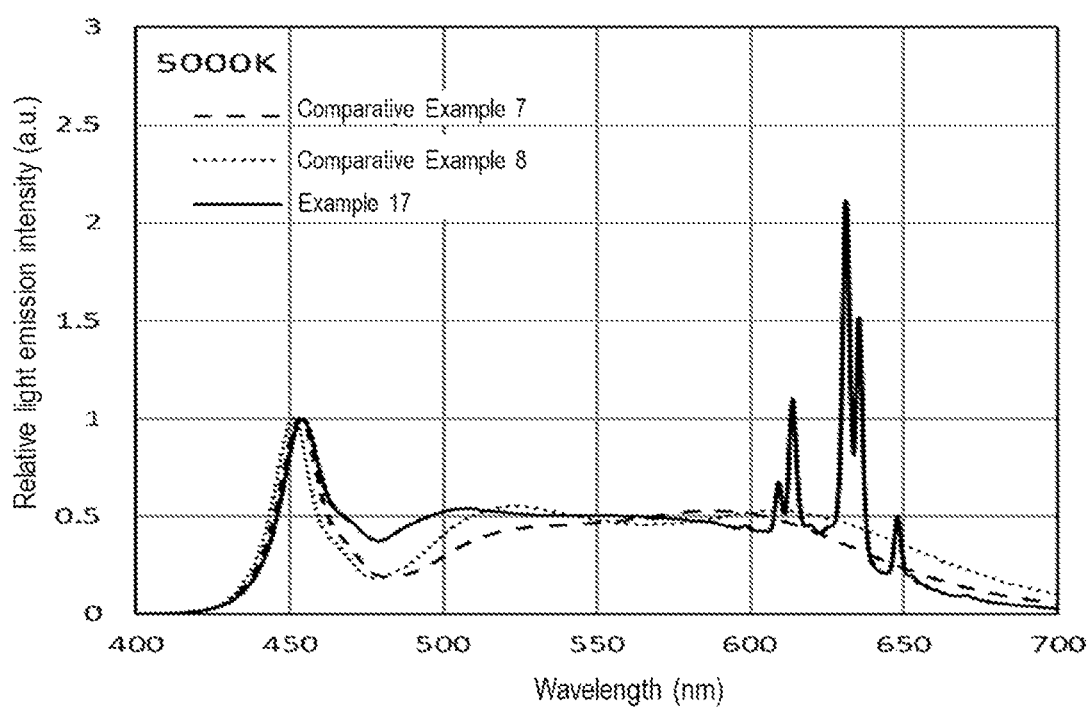
FIG. 20 is an exemplary graph showing a light emission spectrum of a light emission device according to Example 17, and light emission spectra of light emission devices according to Comparative Examples 7 and 8.
Figure 21:
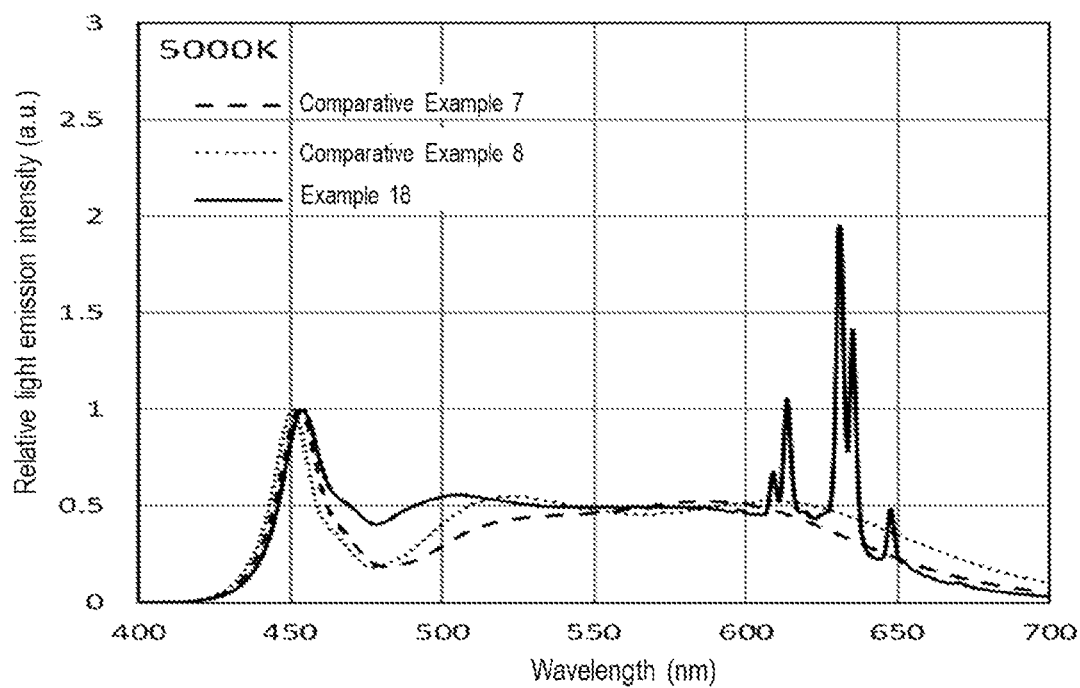
FIG. 21 is an exemplary graph showing a light emission spectrum of a light emission device according to Example 18, and light emission spectra of light emission devices according to Comparative Examples 7 and 8.
Figure 22:
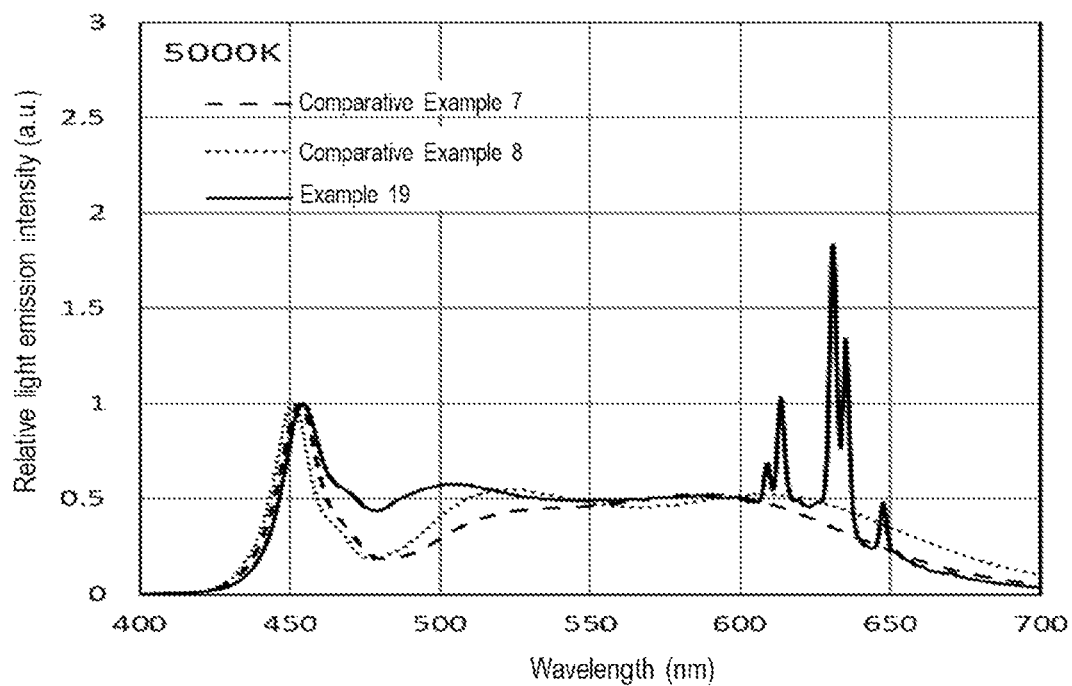
FIG. 22 is an exemplary graph showing a light emission spectrum of a light emission device according to Example 19, and light emission spectra of light emission devices according to Comparative Examples 7 and 8.
Figure 23:
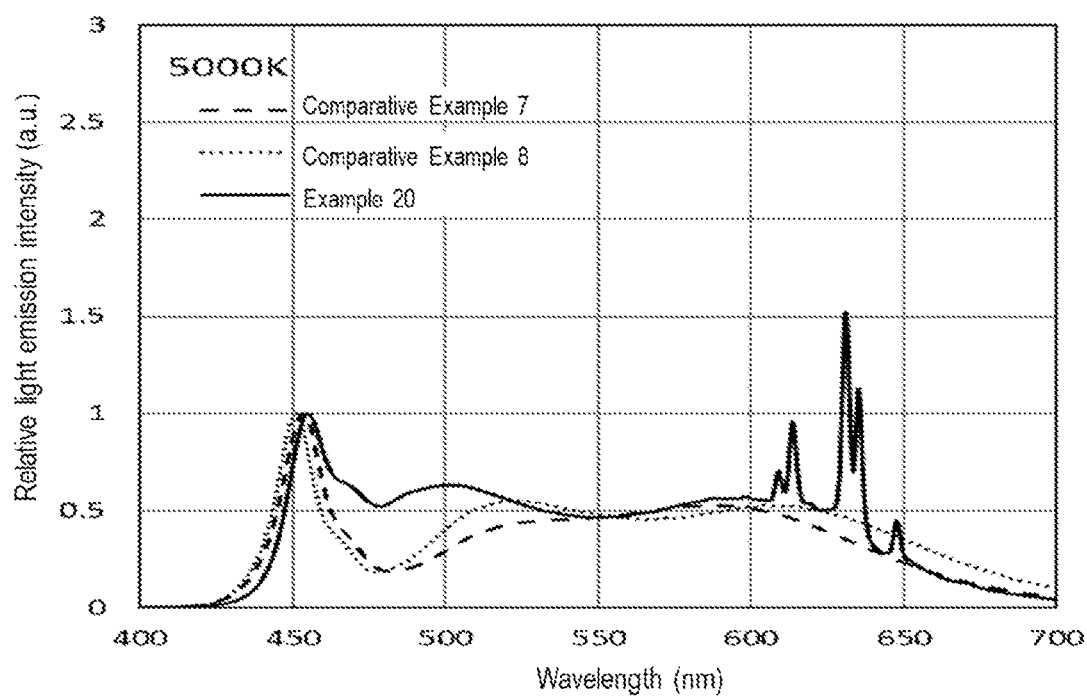
FIG. 23 is an exemplary graph showing a light emission spectrum of a light emission device according to Example 20, and light emission spectra of light emission devices according to Comparative Examples 7 and 8.
Figure 24:
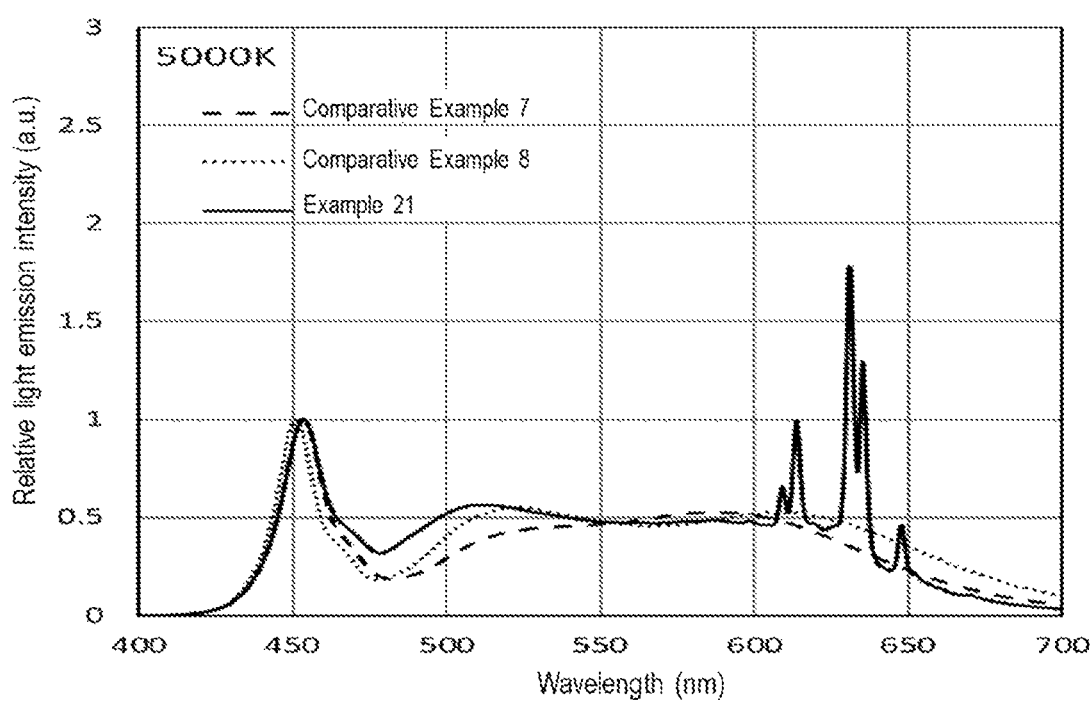
FIG. 24 is an exemplary graph showing a light emission spectrum of a light emission device according to Example 21, and light emission spectra of light emission devices according to Comparative Examples 7 and 8.
Figure 25:
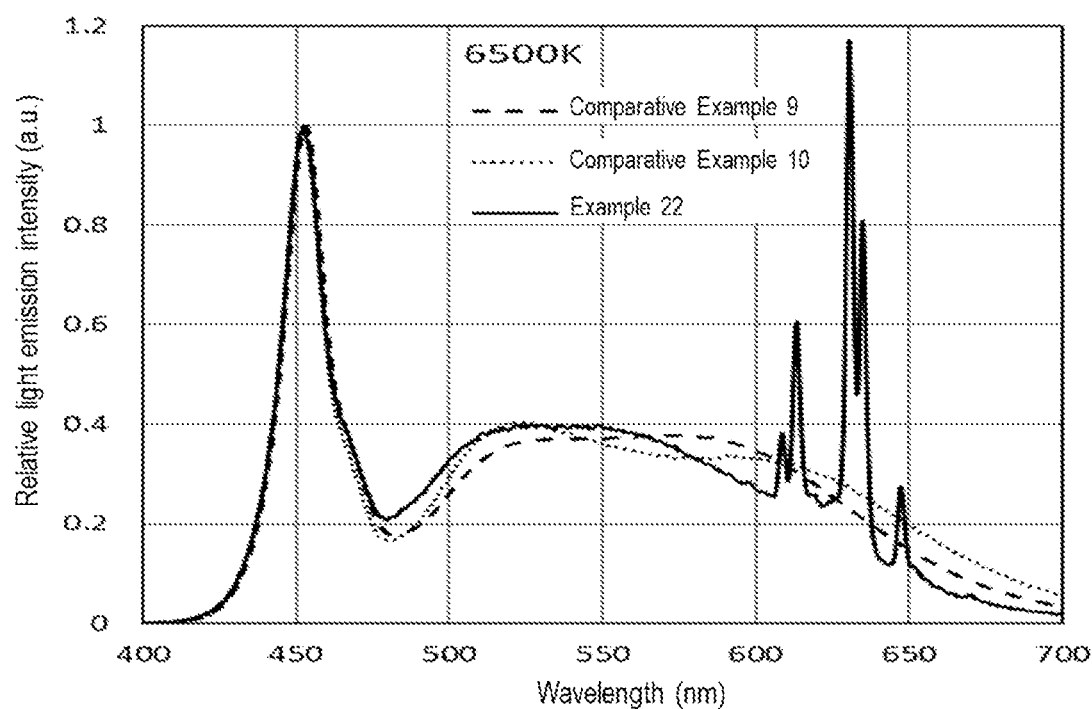
FIG. 25 is an exemplary graph showing a light emission spectrum of a light emission device according to Example 22, and light emission spectra of light emission devices according to Comparative Examples 9 and 10.
Figure 26:
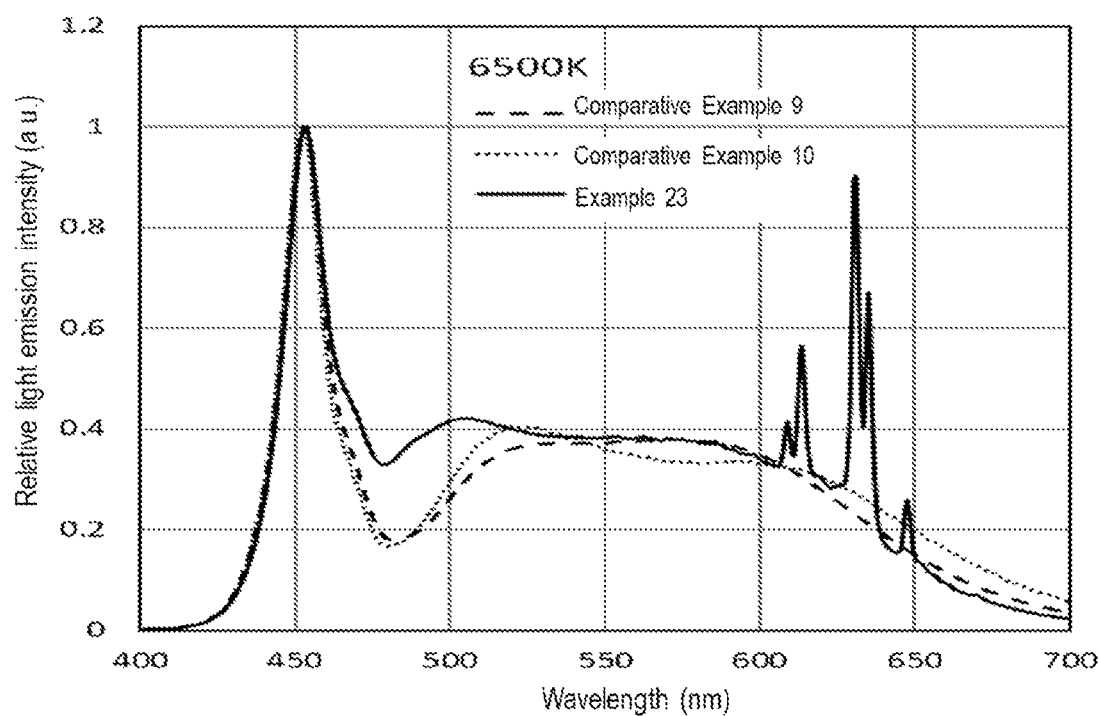
FIG. 26 is an exemplary graph showing a light emission spectrum of a light emission device according to Example 23, and light emission spectra of light emission devices according to Comparative Examples 9 and 10.
Figure 27:
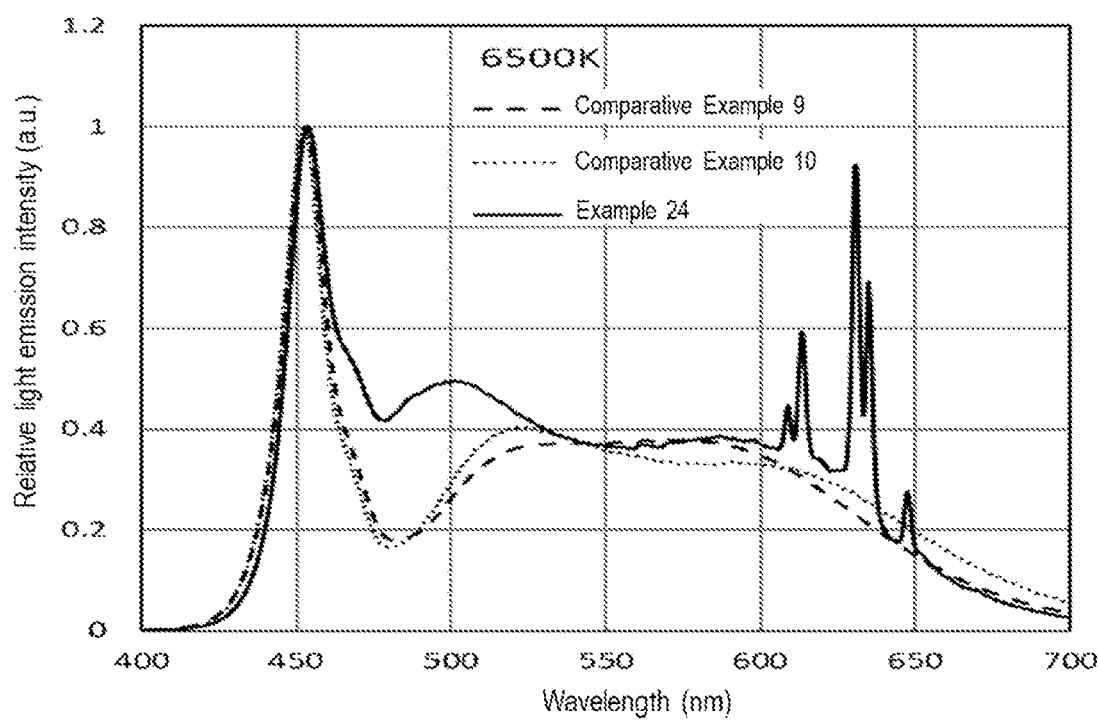
FIG. 27 is an exemplary graph showing a light emission spectrum of a light emission device according to Example 24, and light emission spectra of light emission devices according to Comparative Examples 9 and 10.
Figure 28:
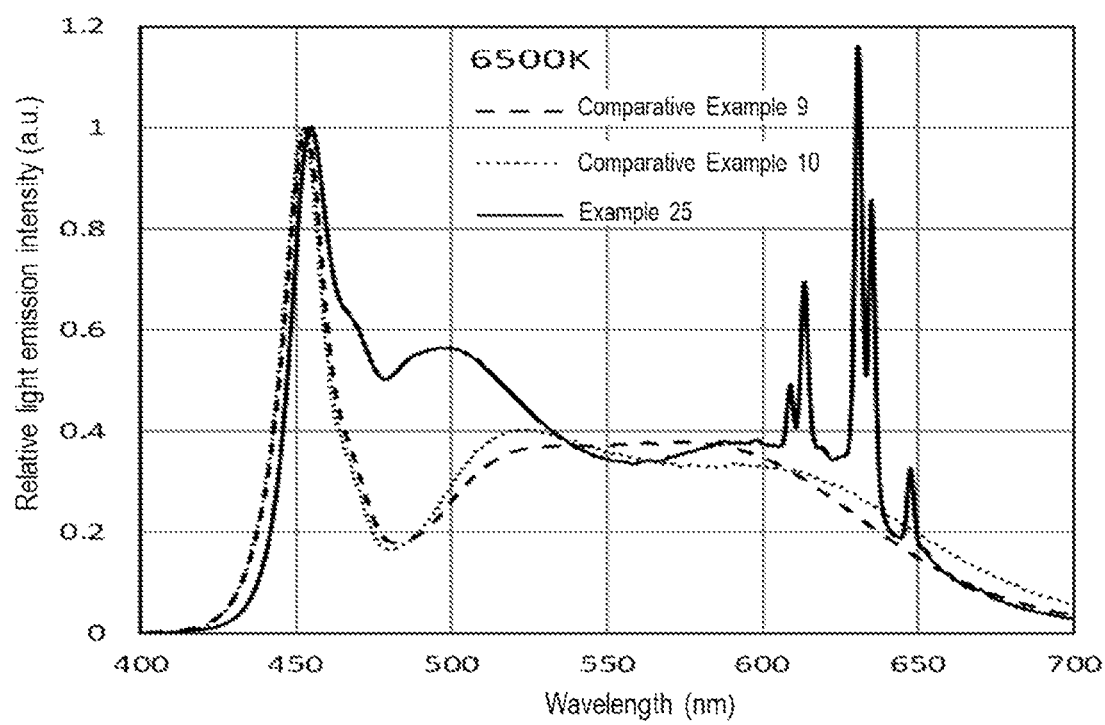
FIG. 28 is an exemplary graph showing a light emission spectrum of a light emission device according to Example 25, and light emission spectra of light emission devices according to Comparative Examples 9 and 10.

For SCASN1 that is a kind of the second fluorescent material and KSF that is a kind of the third fluorescent material, the reflection spectra of the fluorescent materials are shown in FIG. 2, and the light emission spectra and the visual sensitivity spectrum are shown in FIG. 3.

As shown in FIG. 2, SCASN1 has a reflectance in the green wavelength region (wavelength range of approximately 485 nm or more and approximately 573 nm or less, see JIS Z8110) smaller than that of KSF, that is, SCASN1 absorbs more light than KSF in the green wavelength region. Therefore, by using KSF, the light emission of the fluorescent material in the green wavelength region can be emitted to the outside of the light emission device without being absorbed more than SCASN1. It is also found in FIG. 3 that SCASN1 has more light emitting components on the long wavelength side (long wavelength side of 630 nm or more) than KSF. KSF has fewer light emitting components on the relatively long wavelength side, allowing for fewer components in the low wavelength range of the visual sensitivity. Therefore, it is considered that, by using KSF and SCASN together, the decrease in light emission efficiency can be suppressed regardless of high color rendering.

In the WELL certification, points are added by satisfying the standards defined by WELL in each item. In ensuring color rendering quality, it is specified that points are added when Ra is 90 or more, or Ra is 80 or more and R9 is 50 or more. Since the light emission devices in Examples 1 to 3, 5 to 8, 10 to 12, 14 to 19, 21, and 22 to 24 had a Ra of 90 or more, and those in Examples 4, 9, 13, 20, and 25 had a Ra of 80 or more and a R9 of 50 or more, all of the light emission devices in Examples 1 to 25 satisfied the WELL scoring conditions.

The light emission devices in Examples 1 to 25 each show a high MR value at each color temperature, and are thus suitable for lighting used during active hours. It is also suitable for places where precise work is performed since the color rendering properties are high. It is also considered to be suitable for medical examinations at hospitals and other situations where people communicate by looking at each other's faces, since the special color rendering indices R15 are high.

FIGS. 4 to 28 show the light emission spectra of the light emission devices in Examples and Comparative Examples. In the light emission devices in Examples 1 to 25, a characteristic peak peculiar to the third fluorescent material (KSF) having a full width at half maximum of 14 nm or less was confirmed in the range of 600 nm or more and 650 nm or less in the light emission spectra. The light emission spectra of the light emission devices in Examples 1 to 25 reduced the light emission components in the wavelength region having low visual sensitivity of 650 nm or more, compared with the light emission spectra of the light emission devices in Comparative Examples.

Generally, lower color temperatures have lower MR values, and higher color temperatures have higher MR values. Although the MR values can be adjusted by changing the color temperature according to the time of use and application, such as active and inactive times, the preferred light color varies depending on the environment and country of use. With the light emission devices in Examples 1 to 25, it is considered to be able to provide a spectrum showing a high MR value while achieving light colors that users find preferable.

INDUSTRIAL APPLICABILITY

The light emission device according to the present invention is capable of emitting light having a light emission spectrum that suppresses melatonin secretion and is excellent in workability. For example, it can be utilized as general lighting to be installed in indoors, such as offices, general households, commercial facilities, and factories, in-vehicle lighting, displays, lighting for observation, warning light, security light, indicator light, and backlight for liquid crystal.

Furthermore, it can be utilized as a light fixture including the light emission device.

EXPLANATIONS OF LETTERS OR NUMERALS

10: Light emitting element, 40: Molded body, 50: Fluorescent member, 70: Fluorescent material, 71: First fluorescent material, 72: Second fluorescent material, 73: Third fluorescent material, 74: Fourth fluorescent material, and 100: Light emission device.

The invention claimed is:

1. A light emission device comprising
a light emitting element having a light emission peak wavelength in a range of 400 nm or more and 490 nm or less, and
a fluorescent member comprising fluorescent materials including a first fluorescent material having a light emission peak wavelength in a range of 510 nm or more and less than 580 nm, a second fluorescent material having a light emission peak wavelength in a range of 580 nm or more and 680 nm or less and a full width at half maximum of 15 nm or more and 100 nm or less in a light emission spectrum, and a third fluorescent material having a light emission peak wavelength in a range of 600 nm or more and 650 nm or less and a full width at half maximum of 14 nm or less in a light emission spectrum,
wherein the light emission device has a melanopic ratio (MR) value at a correlated color temperature that satisfies any of the following (1) to (5):
(1) the MR value is in a range of 0.47 or more and 0.73 or less when the correlated color temperature is in a range of 2,000 K or more and less than 2,800 K;

(2) the MR value is in a range of 0.53 or more and 0.81 or less when the correlated color temperature is in a range of 2,800 K or more and less than 3,500 K;

(3) the MR value is in a range of 0.68 or more and 1.00 or less when the correlated color temperature is in a range of 3,500 K or more and less than 4,500 K;

(4) the MR value is in a range of 0.84 or more and 1.18 or less when the correlated color temperature is in a range of 4,500 K or more and less than 5,700 K;

(5) the MR value is in a range of 1.00 or more and 1.40 or less when the correlated color temperature is in a range of 5,700 K or more and less than 7,200 K.

2. The light emission device according to claim 1, wherein the melanopic ratio (MR) value at a correlated color temperature satisfies any of the following (1') to (5'):

(1') the MR value is in a range of 0.47 or more and 0.63 or less when the correlated color temperature is in a range of 2,000 K or more and less than 2,800 K;

(2') the MR value is in a range of 0.53 or more and 0.71 or less when the correlated color temperature is in a range of 2,800 K or more and less than 3,500 K;

(3') the MR value is in a range of 0.68 or more and 0.90 or less when the correlated color temperature is in a range of 3,500 K or more and less than 4,500 K;

(4') the MR value is in a range of 0.84 or more and 1.08 or less when the correlated color temperature is in a range of 4,500 K or more and less than 5,700 K; and (5') the MR value is in a range of 1.00 or more and 1.30 or less when the correlated color temperature is in a range of 5,700 K or more and less than 7,200 K.

3. The light emission device according to claim 1, wherein the first fluorescent material has a composition represented by the following formula (1A):

$$(Ln_{1-a}Ce_a)_3(Al_{1-b}Ga_b)_5O_{12} \qquad (1A)$$

wherein Ln includes at least one element selected from the group consisting of Y, Gd, Lu, and Tb; and a and b each satisfy $0.001 \leq a \leq 0.2$ and $0 \leq b \leq 1.0$.

4. The light emission device according to claim 1, wherein the first fluorescent material has a content ratio in a range of 20% by mass or more and 90% by mass or less relative to a total amount of the fluorescent materials contained in the fluorescent member.

5. The light emission device according to claim 1, wherein the second fluorescent material has a composition represented by the following formula (2A):

$$Sr_sCa_tAl_uSi_vN_w{:}Eu \qquad (2A)$$

wherein s, t, u, v, and w each satisfy $0 \leq s < 1$, $0 < t \leq 1$, $s+t \leq 1$, $0.9 \leq u \leq 1.1$, $0.9 \leq v \leq 1.1$, and $2.5 \leq w \leq 3.5$.

6. The light emission device according claim 1, wherein the second fluorescent material has a content ratio in a range of 0.5% by mass or more and 15% by mass or less relative to a total amount of the fluorescent materials contained in the fluorescent member.

7. The light emission device according to claim 1, wherein the third fluorescent material has a composition represented by the following formula (3D):

$$A_2[M^5{}_{1-a1}Mn^{4+}{}_{a1}F_6] \qquad (3D)$$

wherein A includes at least one selected from the group consisting of alkali metals and ammonium ions; $M^5$ includes at least one element selected from the group consisting of Group 4 elements, Group 13 elements, and Group 14 elements; and a1 satisfies $0.01 < a1 < 0.2$.

8. The light emission device according to claim 1, wherein the third fluorescent material has a content ratio in a range of 5% by mass or more and 70% by mass or less relative to total amount of the fluorescent materials contained in the fluorescent member.

9. The light emission device according to a claim 1, wherein the fluorescent member further comprises a fourth fluorescent material having a light emission peak wavelength that is different from the light emission peak wavelength of the first fluorescent material and is in a range of 470 nm or more and 550 nm or less.

10. The light emission device according to claim 9, wherein the fourth fluorescent material has at least one composition selected from the following formulae (4a) and (4b):

$$(Sr_{1-v1}M^1{}_{v1})_4Al_{14}O_{25}{:}Eu \qquad (4a)$$

wherein $M^1$ includes at least one element selected from the group consisting of Mg, Ca, Ba, and Zn, and v1 satisfies $0 \leq v1 \leq 0.5$; and $$M^2{}_8MgSi_4O_{16}X_2{:}Eu \qquad (4b)$$

wherein $M^2$ includes at least one element selected from the group consisting of Ca, Sr, Ba, and Zn, and X includes at least one element selected from the group consisting of F, Cl, Br, and I.

11. The light emission device according to claim 9, wherein the fourth fluorescent material has a content ratio in a range of 1% by mass or more and 70% by mass or less relative to a total amount of the fluorescent materials contained in the fluorescent member.

12. The light emission device according to claim 1, wherein the light emission device has an average color rendering index Ra of 80 or more.

13. The light emission device according to claim 1, wherein the light emission device has an average color rendering index Ra of 90 or more.

14. The light emission device according to claim 1, wherein the light emission device has a special color rendering index R9 of 50 or more.

15. The light emission device according to claim 1, wherein the light emission device has a special color rendering index R15 of 85 or more.

16. A light fixture comprising the light emission device according to claim 1.

* * * * *